(12) United States Patent
Chang et al.

(10) Patent No.: US 12,494,359 B2
(45) Date of Patent: Dec. 9, 2025

(54) STACKED WAFER STRUCTURE AND METHOD FOR FORMING THE SAME

(71) Applicant: Taiwan Semiconductor Manufacturing Company, Ltd., Hsinchu (TW)

(72) Inventors: Yu-Chen Chang, Hsinchu County (TW); Chien-Wen Lai, Hsinchu (TW); Chih-Min Hsiao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/773,220

(22) Filed: Jul. 15, 2024

(65) Prior Publication Data
US 2024/0371625 A1    Nov. 7, 2024

Related U.S. Application Data

(63) Continuation of application No. 17/394,977, filed on Aug. 5, 2021, now Pat. No. 12,080,544.

(60) Provisional application No. 63/177,487, filed on Apr. 21, 2021.

(51) Int. Cl.
*H01L 21/02* (2006.01)
*H01L 21/304* (2006.01)
*H01L 25/065* (2023.01)

(52) U.S. Cl.
CPC .. *H01L 21/02021* (2013.01); *H01L 21/02043* (2013.01); *H01L 21/304* (2013.01); *H01L 25/0657* (2013.01); *H01L 2221/68327* (2013.01)

(58) Field of Classification Search
CPC ......... H01L 21/02021; H01L 21/02043; H01L 2221/68327; H01L 21/304; H01L 25/0657
See application file for complete search history.

(56) References Cited

U.S. PATENT DOCUMENTS

| | | | |
|---|---|---|---|
| 7,129,172 B2* | 10/2006 | Morrow | H01L 21/304 438/455 |
| 11,127,635 B1* | 9/2021 | Lin | H10D 84/038 |
| 11,456,169 B2* | 9/2022 | Chiang | H01L 21/02021 |
| 11,482,506 B2* | 10/2022 | Hsieh | H01L 21/304 |
| 2011/0097874 A1* | 4/2011 | Broekaart | H01L 25/50 438/692 |
| 2021/0091024 A1* | 3/2021 | Uozumi | H01L 24/05 |
| 2021/0134663 A1* | 5/2021 | Huang | H01L 25/50 |
| 2023/0207303 A1* | 6/2023 | Liu | H01L 21/02021 |

* cited by examiner

*Primary Examiner* — Jeff W Natalini
*Assistant Examiner* — Brandon C Fox
(74) *Attorney, Agent, or Firm* — Birch, Stewart, Kolasch & Birch, LLP

(57) ABSTRACT

A method includes bonding a front side surface of a first wafer to a front side of a second wafer; forming a bonding material on a periphery of the first wafer and a periphery of the second wafer; performing a thinning process on the first wafer from a back side surface of the first wafer; after performing the thinning process, performing a trimming process from the back side surface of the first wafer to remove a first portion of the bonding material and partially trim down the periphery of the second wafer from a front side surface of the second wafer.

20 Claims, 24 Drawing Sheets

STACKED WAFER STRUCTURE AND METHOD FOR FORMING THE SAME

PRIORITY CLAIM AND CROSS-REFERENCE

The present application is a Continuation Application of the U.S. application Ser. No. 17/394,977, filed Aug. 5, 2021, which claims priority to U.S. Provisional Application Ser. No. 63/177,487, filed Apr. 21, 2021, which is herein incorporated by reference in its entirety.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
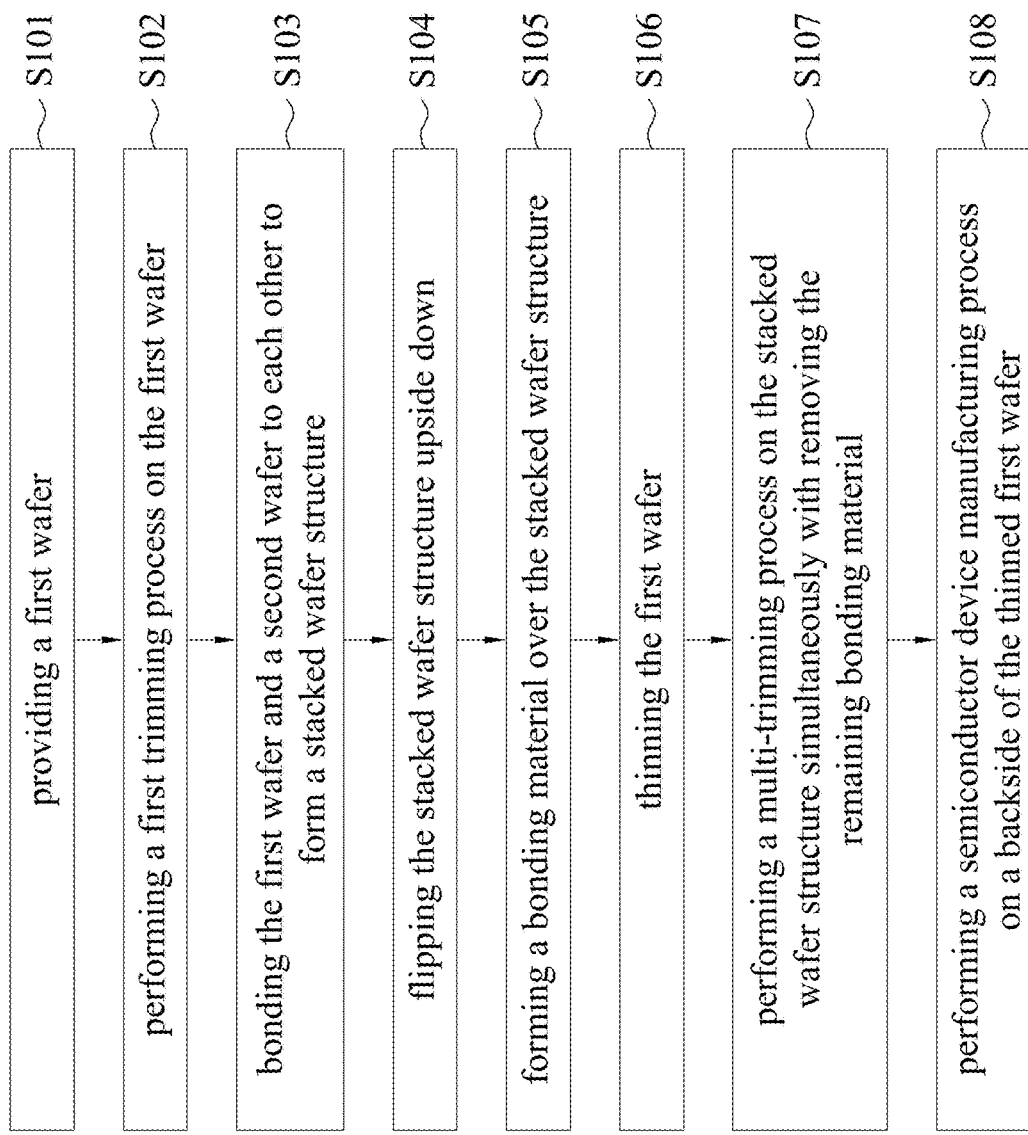
FIG. 1 is a flowchart of a method for forming a stacked wafer structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

In order to perform processes on a backside of a first wafer, an additional second wafer may be bonded to a frontside of the first wafer and function as a carrier wafer. During coating processes on the backside of the first wafer, the coating material, such as photoresist (PR), middle layer (ML) of a tri-layer resist, and bottom layer (BL) of the tri-layer resist may also deposit on a steep wafer edge of the underlying second wafer. Other embodiments may contain more or fewer number of layers in the resist, such as a tetra-layer resist. However, the coating material may have a poor adhesion to the underlying second wafer due to the steep wafer edge of the second wafer, and the coating material may fall of the steep wafer edge of the second wafer to become a defect source during following process and then contaminate the device on the overlying first wafer.

Therefore, the present disclosure in various embodiments provides a multi-trimming process on the underlying second wafer. An advantage is that after the multi-trimming process is performed, the underlying second wafer may have a stepped sidewall structure having more than two step rises, which in turn allows for improving the surface roughness, such that the subsequent coating material may only minimally fall off the edge of the underlying second wafer to minimize poor coating, and thus the pollution on the first wafer may be reduced, so as to increase production efficiency and lower associated costs.

Referring now to FIG. 1, illustrated is a flowchart of an exemplary method M for fabrication of a stacked wafer structure in accordance with some embodiments. The method M includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M includes fabrication of a semiconductor device. However, the fabrication of the semiconductor device is merely an example for describing the manufacturing process according to some embodiments of the present disclosure.

Figure 2:
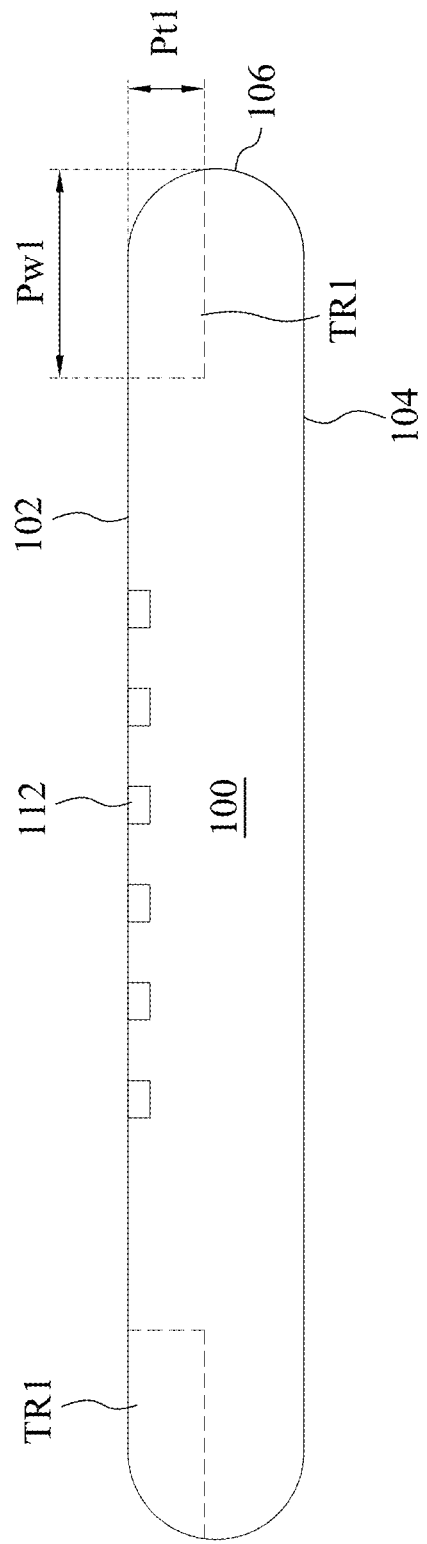
FIGS. 2-7, 8A, 9A, 10A, 11A, and 12 illustrate a method in various stages of forming a stacked wafer structure in accordance with some embodiments of the present disclosure.

FIGS. 2-12 illustrate the method M in various stages of forming a stacked wafer structure in accordance with some embodiments of the present disclosure. The method M begins at block S101 where a first wafer is provided. Referring to FIG. 2, in some embodiments of block S101, a first wafer 100 is provided. In some embodiments, the first wafer 100 has a first surface 102, a second surface 104 opposite to the first surface 102, and an edge 106 connecting between the first surface 102 and the second surface 104. It is to be noted that, for example, a side where the first surface 102 is located may be referred to as the front side of the first wafer 100, and the opposite side where the second surface 104 is located may be referred to as the backside of the first wafer 100. The first wafer 100 may be of any appropriate size and shape. In some embodiments, the first wafer 100 is a substantially circular wafer. The edge 106 in FIG. 2 is illustrated as being a curve-shaped edge or a rounded edge. In other embodiments, the first wafer 100 may have a chamfered edge or a beveled edge.

In some embodiments, the first wafer 100 may be a semiconductor wafer such as a silicon bulk wafer or a gallium arsenide wafer. In some embodiments, the first wafer 100 may include, for example, silicon, strained silicon, a silicon alloy, silicon carbide, silicon-germanium, silicon-germanium carbide, germanium, a germanium alloy, germanium-arsenic, indium-arsenic, group III-V semiconductors, or a combination thereof. In some embodiments, the first wafer 100 is a device wafer. In some embodiments, the first wafer 100 includes a plurality of devices 112 which may be formed at the first surface 102 of the first wafer 100. The devices 112 may be, for example, active devices such as transistors or other active devices. In some embodiments, the devices 112 are light sensing devices or image sensors capable of converting light to electrical signals formed and located at the front side of the first wafer 100. In some embodiments, the devices 112 may include, for example, photo diodes (PD), photo transistors, or a combination thereof. In some embodiments, the devices 112 may include, for example, CMOS image sensors (CIS) or charge-coupled device (CCD) sensors. The devices 112 are located relatively distanced from the edge 106 (the periphery of the first wafer 100) such that the following trimming processes may be carried out without damaging the devices 112. In some embodiments, additional semiconductor devices or electrical components with different functions or integrated circuits may also be included in the first wafer 100. In some embodiments, interconnect structures (not illustrated) may be formed over the first wafer 100 and electrically coupled with the devices 112 and/or other electrical components. The scope of the disclosure is not limited to these embodiments or to what is depicted in the drawings.

Figure 3:
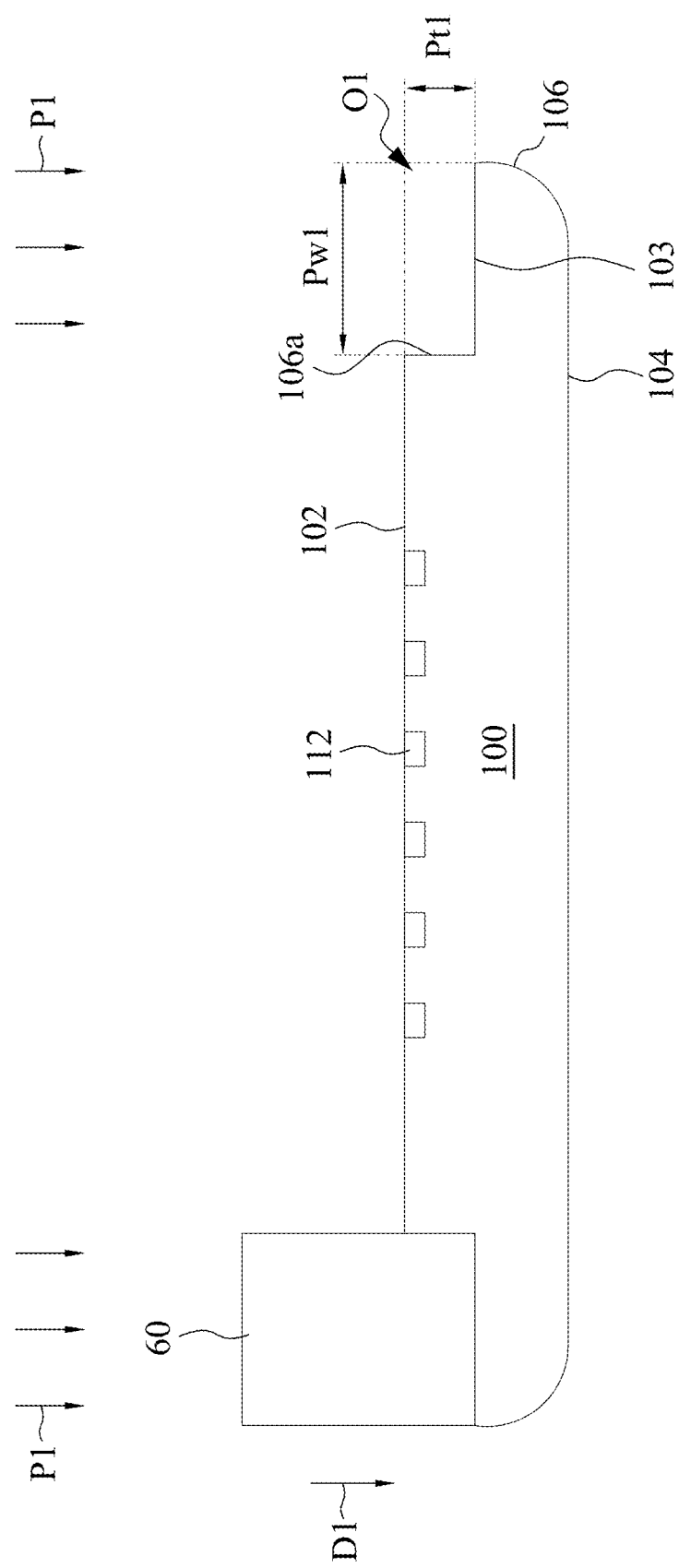

Referring back to FIG. 1, the method M then proceeds to block S102 where a first trimming process is performed on the first wafer. With reference to FIG. 3, in some embodiments of block S102, a trimming process P1 is performed on the first wafer 100. For example, an annular ring TR1 (see FIG. 2) around the periphery of the first wafer 100 is removed from the first wafer 100 by performing the trimming process P1. In some embodiments, the trimming process P1 includes cutting or trimming off a portion of the first wafer 100 by mechanical machining from the first surface 102 vertically downward (i.e., towards the second surface 104 but not cutting through to the same) along the thickness direction D1 to form a trimmed edge 106a near the periphery of the first wafer 100. In some embodiments, the trimming process P1 is performed by a trimming tool 60 cutting substantially vertically or slantedly into the first wafer 100 to a trimming depth Pt1. In some embodiments, the trimming tool 60 includes a scribing wheel or a trimming blade wheel. Alternatively, the trimming process P1 is performed through any other suitable tools capable of mechanically cutting away the material of the wafer structure, and the scope of the disclosure is not limited thereto. For example, during the trimming process P1, the trimming tool 60 rotates and moves along the circular path of the periphery of the first wafer 100 for wafer-edge trimming.

In some embodiments, after the trimming process P1, the annular ring TR1 (see FIG. 2) is removed to form a ring-shaped opening O1 at the periphery of the first wafer 100. During the trimming process P1, the removed annular ring TR1 may have a width Pw1 and the trimming depth Pt1. In FIG. 3, in a cross-sectional view, the ring-shaped opening O1 has an L-shaped appearance, and the sidewall of the ring-shaped opening O1 is the trimmed edge 106a. In some embodiments, the trimmed edge 106a is substantially perpendicular to the first surface 102. In some embodiments, the trimmed edge 106a is slanted with respect to the first surface 102. In some embodiments, the trimming process P1 results in a stepped cross-section on periphery of the wafer 100, wherein the stepped cross-section has a first step run 102, a second step run 103 lower than the first step 102, and a step rise 106a connecting the second step 103 to the first step 102.

In some embodiments, the thickness Pt1 (i.e., the trimming depth Pt1) is measured from a bottom surface 103 of the opening O1 to a reference plane extending from the first surface 102. In some embodiments, the width Pw1 is measured from the trimmed edge 106a to a reference plane extending from the edge 106. In some embodiments, the first wafer 100 is a silicon wafer having a diameter of about 12 inches (about 300 mm). In such embodiments, the trimming depth Pt1 ranges from about 50 microns to about 150 microns (e.g., the trimming depth Pt1 is about 100 microns), by way of example but not limiting the present disclosure. In such embodiments, the width Pw1 ranges from about 0.8 mm to about 1.5 mm (e.g., the width Pw1 is about 1.2 mm), by way of example but not limiting the present disclosure. It is appreciated that the thickness Pt1 and the width Pw1 may be modified depending on the dimensions of the wafer and the design requirements of the product, and are not limited to the measurements given above.

In some embodiments, the trimming process P1 may be a photolithography patterning process to remove the annular ring TR1 as shown in FIG. 2. For example, a patterned mask (not shown) may be formed over the first surface 102 of the first wafer 100 and used to protect the devices 112 on the first wafer 100 underlying thereof from an etching process. Subsequently, the etching process is performed on the first wafer 100 through the patterned mask and stops until the desired trimming thickness is reached. The etching process may include a dry etch, a wet etch, a reactive ion etch (RIE), another suitable etching process, or combinations thereof. Accordingly, the ring-shaped opening O1 may be formed as shown in FIG. 3. The patterned mask subsequently stripped, such as by wet stripping or plasma ashing. By using the photolithography patterning, the trimming depth Pt1 as shown in FIG. 3 may be in a range from about 0.5 µm to about 5 µm and the width Pw1 may be in a range from about 0.5 mm to about 4 mm, by way of example but not limiting the present disclosure.

Figure 4:
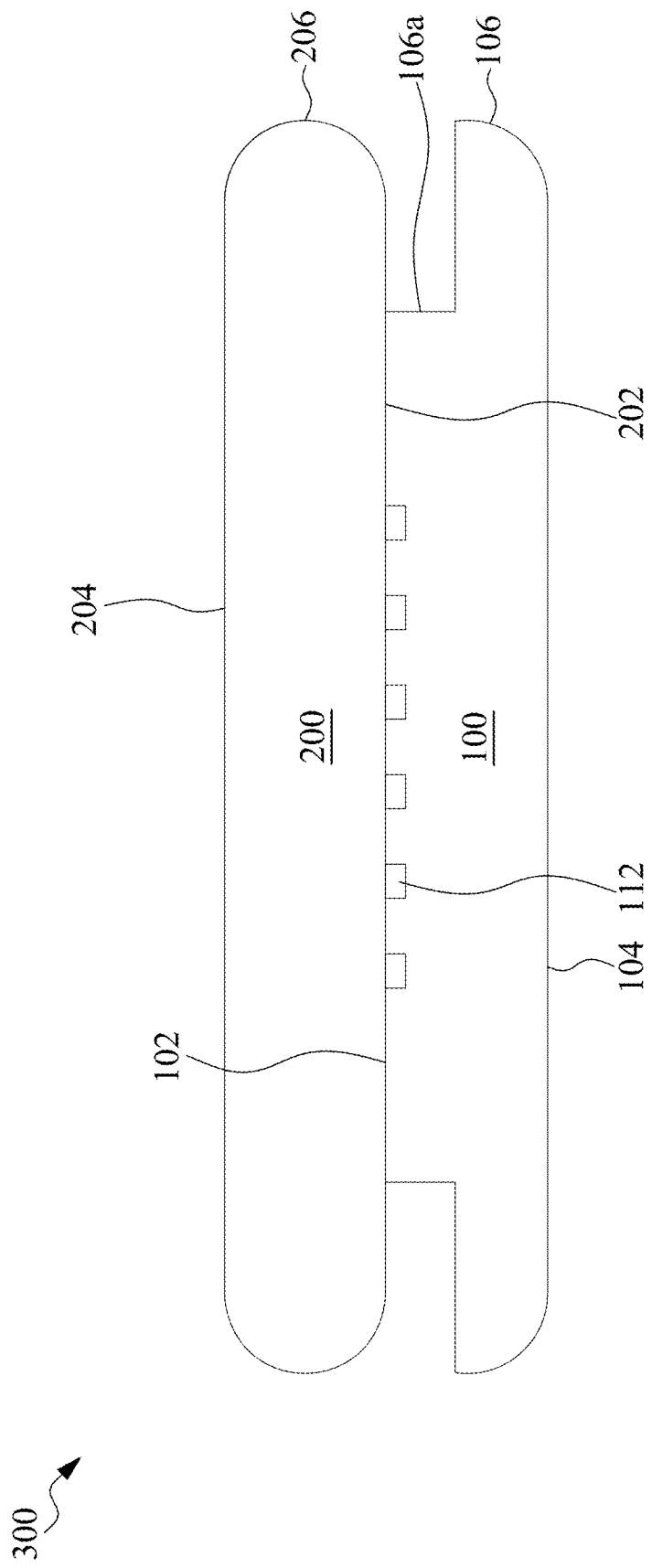

Referring back to FIG. 1, the method M then proceeds to block S103 where the first wafer and a second wafer are bonded to each other to form a stacked wafer structure. With reference to FIG. 4, in some embodiments of block S103, the first wafer 100 and a second wafer 200 are bonded to each other to form a stacked wafer structure 300. The second wafer 200 having a top surface 202, a bottom surface 204 opposite to the top surface 202 and an edge 206 connected between the top surface 202 and the bottom surface 204 is provided. In some embodiments, the second wafer 200 is a semiconductor wafer and functions as a carrier wafer. In some embodiments, the second wafer 200 may include, for example, silicon, strained silicon, a silicon alloy, silicon carbide, silicon-germanium, silicon-germanium carbide, germanium, a germanium alloy, germanium-arsenic, indium-arsenic, group III-V semiconductors, or a combination thereof. In some embodiments, the second wafer 200 includes glass or ceramic materials. In some embodiments, the edge 206 of the second wafer 200 can be interchangeably referred to as a bevel of the second wafer 200. In some embodiments, the first wafer 100 and the second wafer 200 have the same diameter. In other embodiments, the first wafer 100 and the second wafer 200 may have different diameters. The dimensions of the first wafer 100 and the second wafer 200 may depend on the design requirements and construe no limitation in the disclosure. When bonding the first wafer 100 and the second wafer 200, the molecular bonding technique may be employed. For example, the first surface 102 of the first wafer 100 and the top surface 202 of the second wafer 200 are brought into direct contact, and the first wafer 100 and the second wafer 200 are bonded through the Van der Waals force without using a specific bonding material or an adhesive.

It is noted that the molecular bonding technique may require the surfaces of the first wafer 100 and the second wafer 200 to be bonded to be smooth and also free from particles or contamination. Before bonding the first wafer 100 and the second wafer 200, the first surface 102 of the first wafer 100 and/or the top surface 202 of the second wafer 200 may be treated by a cleaning process to remove particles thereon. After the cleaning process, the first wafer 100 and the second wafer 200 are placed sufficiently close together for contact to be initiated. In this state, a force of attraction between the first surface 102 of the first wafer 100 and the top surface 202 of the second wafer 200 is high enough to cause molecular bonding induced by the Van der Waals force.

In some embodiments, in FIG. 4, after bonding the first wafer 100 and the second wafer 200, an annealing process may be performed to strengthen the bonding between the first wafer 100 and the second wafer 200. The temperature of the annealing process may depend on the design requirements. For example, the higher the temperature of the annealing process, the greater the resulting bonding strength. In other embodiments in which the electrical components are distributed in the first wafer 100, the temperature of the annealing process is limited to a relatively low temperature so as not to damage the electrical components.

Figure 5:
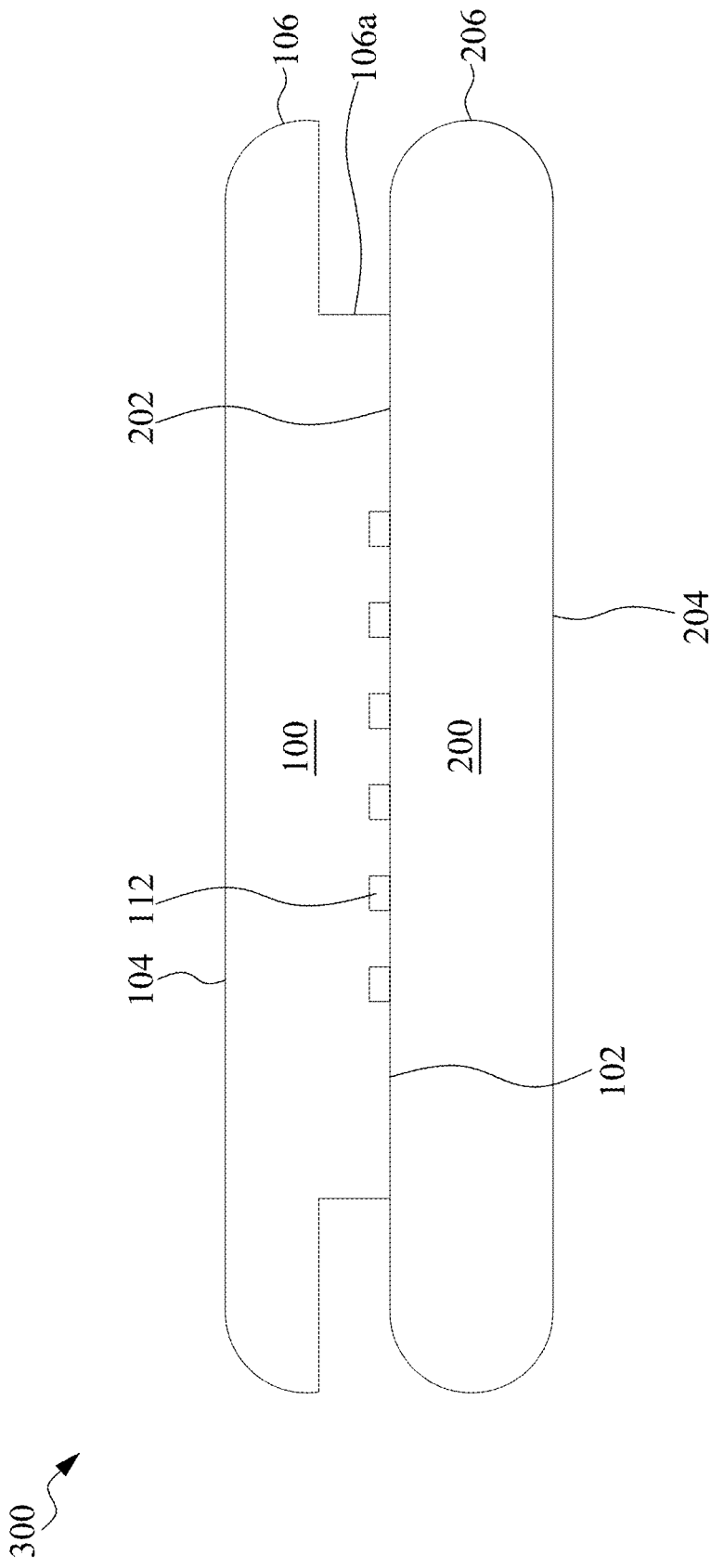

Referring back to FIG. 1, the method M then proceeds to block S104 where the stacked wafer structure is flipped upside down. With reference to FIG. 5, in some embodiments of block S104, the stacked wafer structure 300 is flipped upside down. After flipping, the second surface 104 of the first wafer 100 faces upwardly and the first wafer 100 is carried by the second wafer 200 for subsequent processes. The flipping process may be optional in some embodiments.

Figure 6:
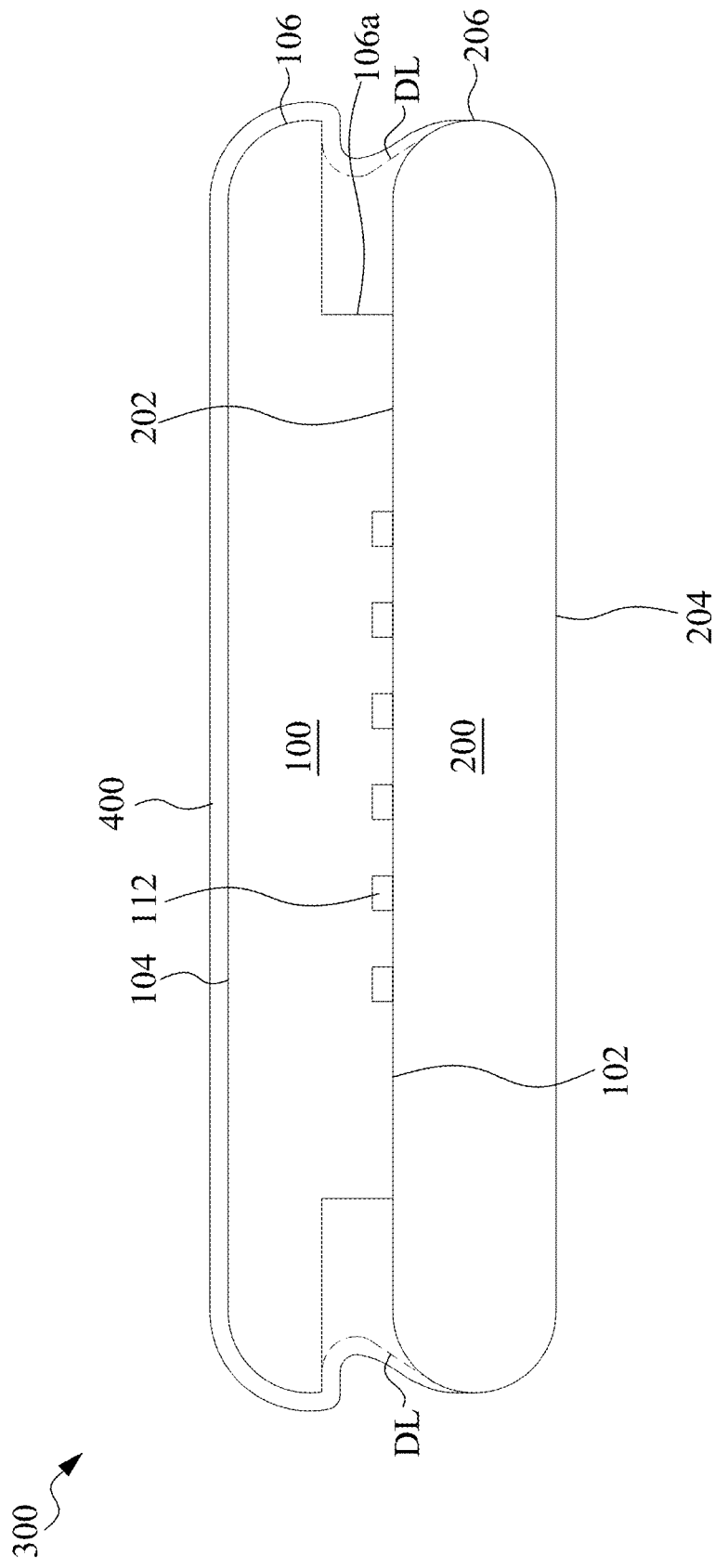
Figure 7:
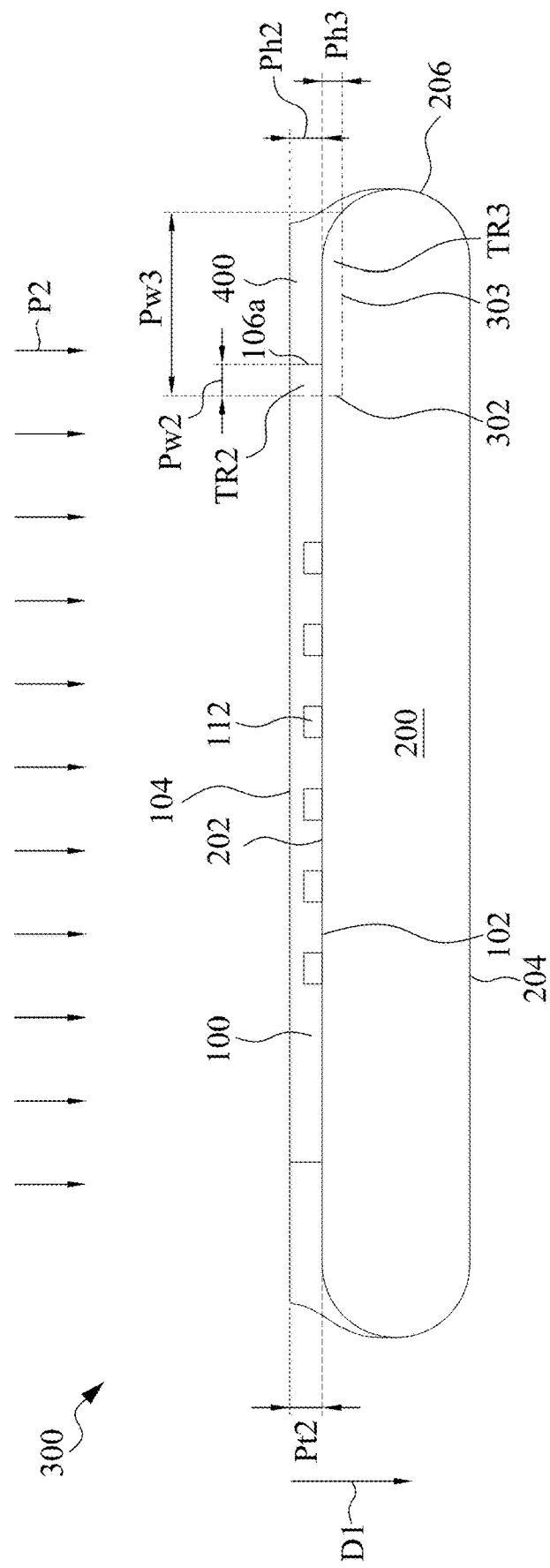

Referring back to FIG. 1, the method M then proceeds to block S105 where a bonding material is formed over the stacked wafer structure. With reference to FIG. 6, in some embodiments of block S105, a bonding material 400 is formed over the stacked wafer structure 300 to strengthen the bonding between the first wafer 100 and the second wafer 200, so as to prevent the first and second wafers 100 and 200 from relative movement during a subsequent thinning process on the wafer 100 as shown in FIG. 7, which may in turn allow for reducing localized stress concentration at the first surface 102 and easing chip cracking induced by the stress, such that the production yield is significantly improved. In FIG. 6, the bonding material 400 is formed on upper surfaces of the first wafer 100 and portions of the second wafer 200. The bonding material 400 is blocked from portions between the first and second wafers 100 and 200. A portion of the bonding material 400 is shown on or partially on an outer edge of the second wafer 200. In some embodiments, the bonding material 400 is formed on the trimmed edge 106a of the wafer 100 and the top surface 202 of the second wafer 200 to strengthen the bonding between the first wafer 100 and the second wafer 200, while leaving the second surface 104 of the first wafer 100 and the bottom surface 204 of the second wafer 200 uncovered by the bonding material 400, as indicated by the dash line DL.

In some embodiments, the forming of the bonding material 400 may be performed by a dispensing process, a spot glue process, or combinations thereof, by way of example but not limiting the present disclosure. In some embodiments, the bonding material 400 may be made of an epoxy resin, a cyanate ester, a fragrant force-epoxidation, or combinations thereof, by way of example but not limiting the present disclosure.

Referring back to FIG. 1, the method M then proceeds to block S106 where the first wafer 100 is thinned through a thinning process P2. With reference to FIG. 7, in some embodiments of block S106, the first wafer 100 is thinned (i.e., the thickness of the first wafer 100 is reduced) from the second surface 104 along the thickness direction D1 in a state in which the second wafer 200 carries the first wafer 100, in which the bonding material 400 prevents the first and second wafers 100 and 200 from relative movement during the thinning process P2. Simultaneously, the thinning process P2 removes portions of the bonding material 400 from the thinned first wafer 100. In some embodiments, the thinning process P2 is a mechanical machining process. In some embodiments, the thinning process P2 may include, for example, a grinding process, a chemical mechanical polishing (CMP) process, or another suitable polishing process. In some embodiments, the first wafer 100 is thinned from the second surface 104 downward towards the first surface 102. During the thinning process P2, the stacked wafer structure 300 may be held by a wafer holder (not illustrated). The thinning process P2 thins the first wafer 100 to a desired thickness Pt2. For example, the thickness Pt2 of the first wafer 100 ranges from about 5 microns to about 50 microns, by way of example but not limiting the present disclosure. In some embodiments, the wafer thinning process includes one or more thin-down processes. The wafer thinning process is performed to reduce the thickness of the first wafer 100 (on which the devices 112 or other electrical components are formed) until it reaches the desired thickness Pt2.

In order to perform processes on the backside of the first wafer 100, the additional second wafer 200 is bonded to the frontside of the first wafer 100 and functions as a carrier wafer. During coating processes on the backside of the first wafer 100, the coating material, such as photoresist (PR), middle layer (ML) of a tri-layer resist, and bottom layer (BL) of the tri-layer resist may also deposit on a steep wafer edge of the underlying second wafer. Other embodiments may contain more or fewer number of layers in the resist, such as a tetra-layer resist. However, the coating material may have a poor adhesion to the steep wafer edge, which may cause the coating material to fall off the steep wafer edge of the underlying second wafer and pollute the overlying first wafer 100. Therefore, the present disclosure in various embodiments provides a multi-trimming process shown in block S107 of the method M hereafter. After the multi-trimming process is performed, the underlying second wafer 200 may have a stepped sidewall structure which in turn allows for improving the adhesion between the subsequent coating material and the underlying second wafer 200, such that the subsequent coating material may only minimally fall off the edge 206 of the second wafer 200, and thus the pollution on the first wafer 100 may be reduced, so as to increase production efficiency and lower associated costs.

Referring back to FIG. 1, the method M then proceeds to block S107 where a multi-trimming process is performed on the stacked wafer structure simultaneously with removing the remaining bonding material. In certain embodiments of block S107, with reference to FIGS. 8A-11E, the multi-trimming process is a sequence of trimming steps. For example, the multi-trimming process may involve performing a first trimming step (e.g., FIGS. 8A and 8B) on the stacked wafer structure 300 simultaneously with removing the remaining bonding material 400 on the trimmed edge 106a of the wafer 100 and on the top surface 202 of the wafer 200. Subsequently, the multi-trimming processing may involve performing a plurality of second trimming steps (e.g., FIGS. 9A-10B) on the second wafer 200 of the stacked wafer structure 300 simultaneously with removing the remaining bonding material 400 on the edge 206 of the wafer 200 until all of the remaining bonding material 400 is removed from the second wafer 200 to form a structure having a stepped sidewall as shown in FIGS. 11A and 11B.

Figure 8A:
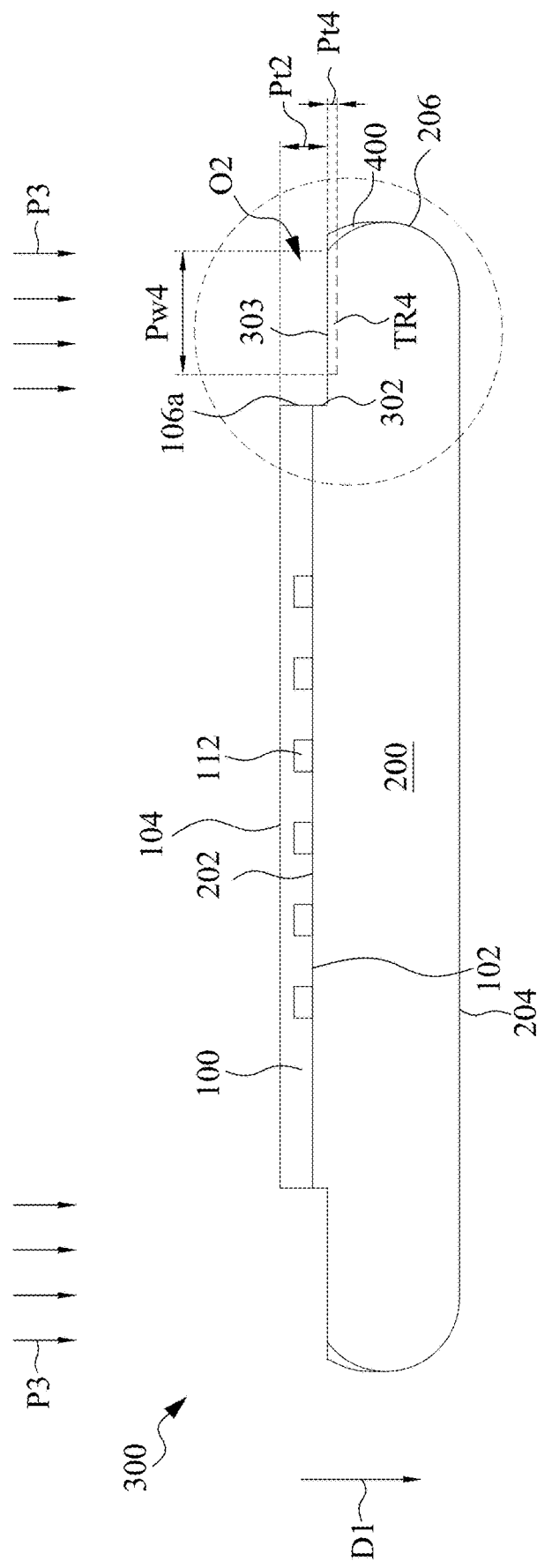
Figure 8B:
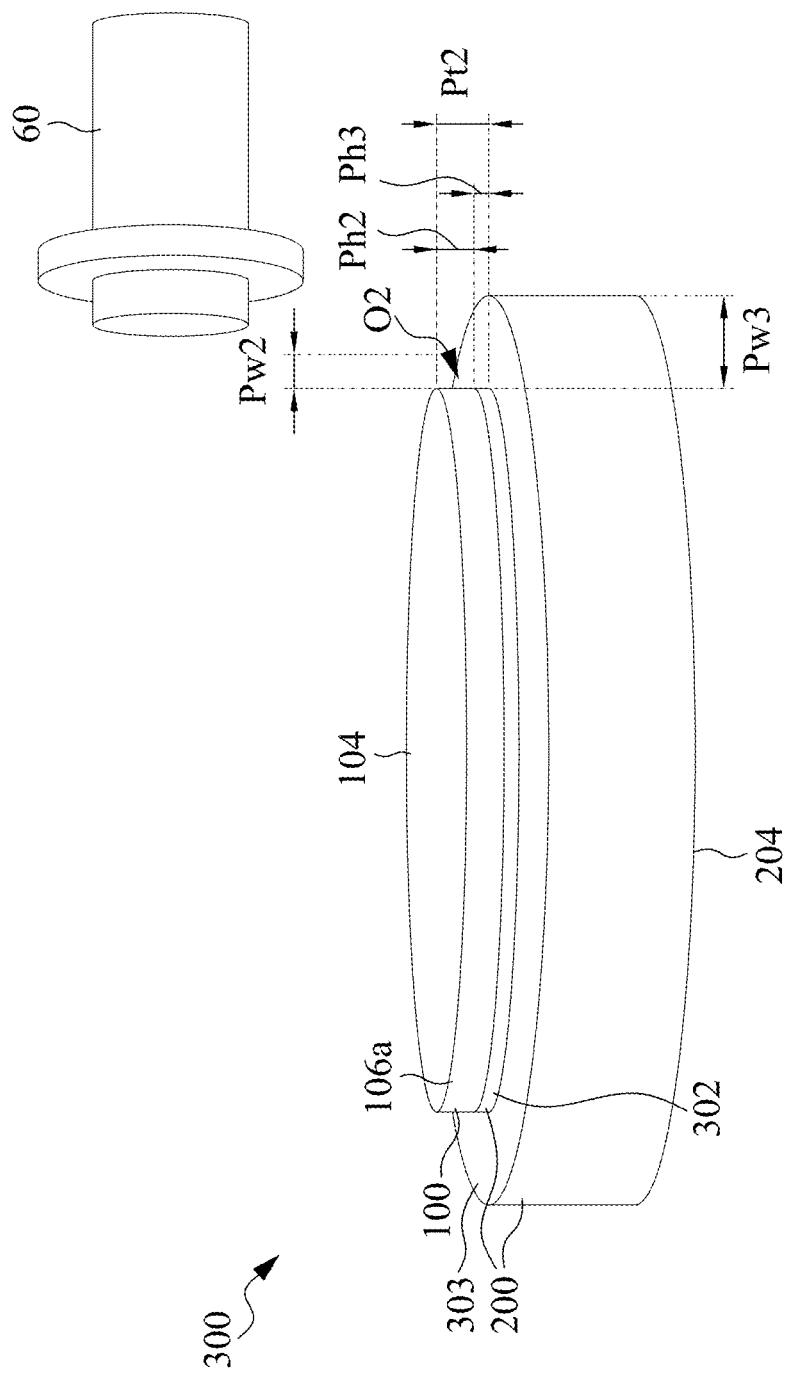
FIG. 8B illustrates a perspective view of the stacked wafer structure of FIG. 8A.
Figure 8C:
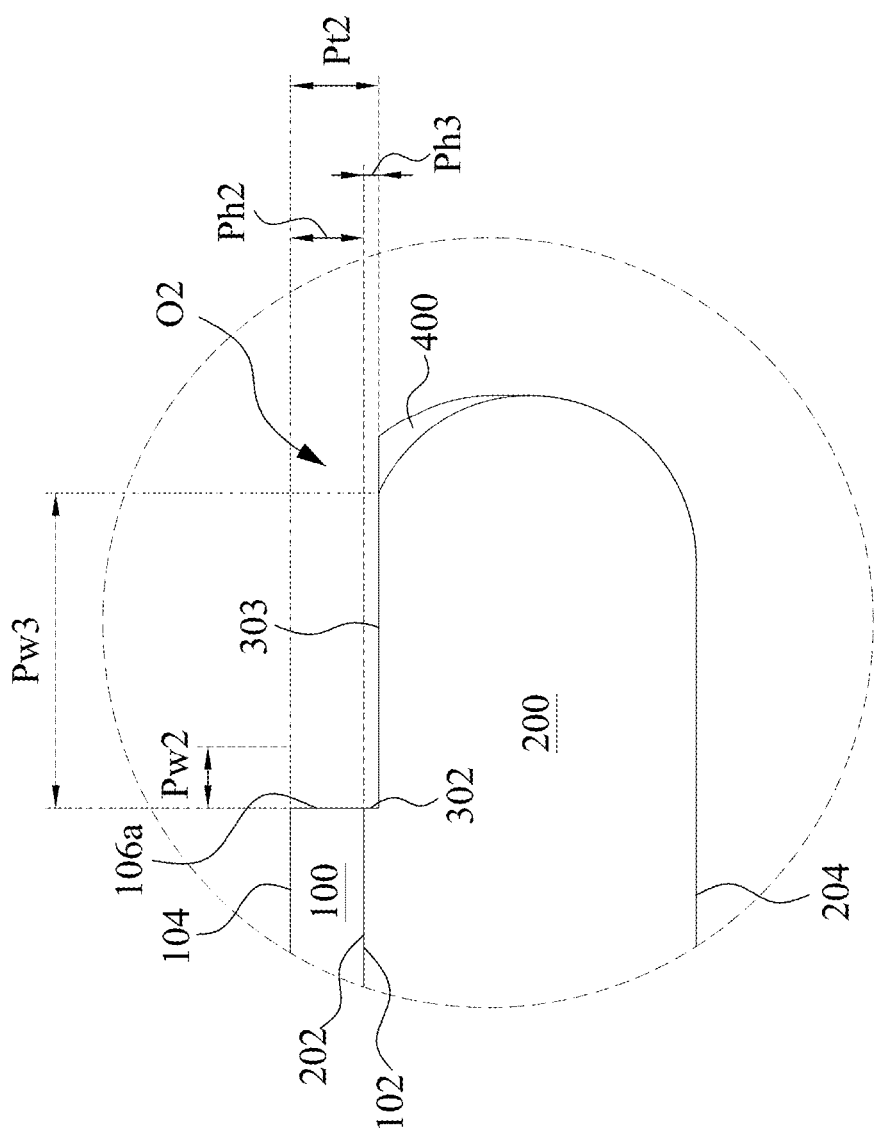
FIGS. 8C, 9B, 10B, and 11B illustrate local enlarged views of the stacked wafer structure according to regions in FIGS. 8B, 9B, 10B, and 11B, respectively.

With reference to FIGS. 8A-8C, a trimming step P3 is performed on the stacked wafer structure 300 simultaneously with removing the remaining bonding material 400 on the trimmed edge 106a of the wafer 100 and on the top surface 202 of the wafer 200. By way of example but not limiting the present disclosure, the trimming step P3 is performed from the second surface 104 of the first wafer 100 downward to the second wafer 200 along the thickness direction D1 to form a trimmed edge 302 at the periphery of the stacked wafer structure 300. In some embodiments, the trimming step P3 is performed by the trimming tool 60 (See FIG. 8B) cutting substantially vertically or slantedly into the stacked wafer structure 300 to a trimming depth Pt2. That is, during the trimming step P3, the thinned first wafer 100 is cut through and the second wafer 200 is partially cut or trimmed to have a ring-shaped opening O2 having the depth Pt2 at the periphery of the stacked wafer structure 300. The trimming depth Pt2 is measured from a bottom surface 303 of the opening O2 to a reference plane extending from the second surface 104 of the first wafer 100. In some embodiments, the trimming step P3 is carried out by mechanical machining which is similar with the trimming process P1, and therefore, a detailed description is omitted herein.

In some embodiments, the trimming step P3 is performed to remove an edge portion of the stacked wafer structure 300 including an annular ring TR2 (see FIG. 7) on the overlying first wafer 100 and an annular ring TR3 (see FIG. 7) on the underlying second wafer 200. In some embodiments, the annular ring TR2 (see FIG. 7) may be a periphery of the first wafer 100 and has a width Pw2 and a height Ph2 (see FIG. 7). The width Pw2 may be measured from a reference plane extending from the trimmed edge 106a to a reference plane extending from the trimmed edge 302, and the height Ph2 may be measured from a reference plane extending from the top surface 202 of the second wafer 200 to a reference plane extending from the second surface 104 of the first wafer 100. In some embodiments, the height Ph2 of the annular ring TR2 may be substantially the same as the thickness Pt2 of the first wafer 100 after the thinning process P2. In some embodiments, the annular ring TR3 (see FIG. 7) may be a periphery of the second wafer 200 and has a width Pw3 and a height Ph3 (see FIG. 7). The width Pw3 may be measured from a reference plane extending from the edge 206 to a reference plane extending from the trimmed edge 302 (see FIG. 8A), and the height Ph3 may be measured from a reference plane extending from the bottom surface 303 (see FIG. 8A) of the opening O2 to a reference plane extending from the top surface 202 of the second wafer 200.

In some embodiments, the trimming depth Pt2 as shown in FIG. 8A may be less, but not limited to, than the thickness Pt1 as shown in FIG. 3. By way of example but not limiting the present disclosure, the trimming depth Pt2 may range from about 5 microns to about 50 microns. In some embodiments in which the first wafer 100 and the second wafer are silicon wafers having a diameter of about 12 inches, the width Pw2 as shown in FIG. 7 may range from about 0.5 mm to about 4.5 mm, and the width Pw3 as shown in FIG. 7 may range from about 1 mm to about 5 mm. In some embodiments in which the first wafer 100 and the second wafer are silicon wafers having a diameter of about 12 inches, the height Ph2 as shown in FIG. 7 may range from about 0.005 mm to about 0.05 mm, and the height Ph3 as shown in FIG. 7 may range from about 0.001 mm to about 0.05 mm. It should be noted that the dimensions of the annular ring TR2 and TR3 may be modified according to the dimensions of the wafer and the design requirements of the product, and are not limited to the dimensions given herein.

In some embodiments, after removing the annular ring TR2 (see FIG. 7) of the first wafer 100 and the annular ring TR3 (see FIG. 7) of the second wafer 200, the ring-shaped opening O2 as shown in FIG. 8A is formed at the periphery of the stacked wafer structure 300. The ring-shaped opening O2 shown in FIG. 8A has an L-shaped appearance, and the sidewall of the ring-shaped opening O2 is the trimmed edge 302. In some embodiments, the trimmed edge 302 is substantially perpendicular to the second surface 104 of the first wafer 100. In some embodiments, the trimmed edge 302 of the stacked wafer structure 300 is slanted with respect to the second surface 104. The depth of the opening O2 shown in FIG. 8A is the trimming depth Pt2 (see FIG. 7), and the width of the opening O2 shown in FIG. 8A is the width Pw3 (see FIG. 7) on the second wafer 200.

Figure 9A:
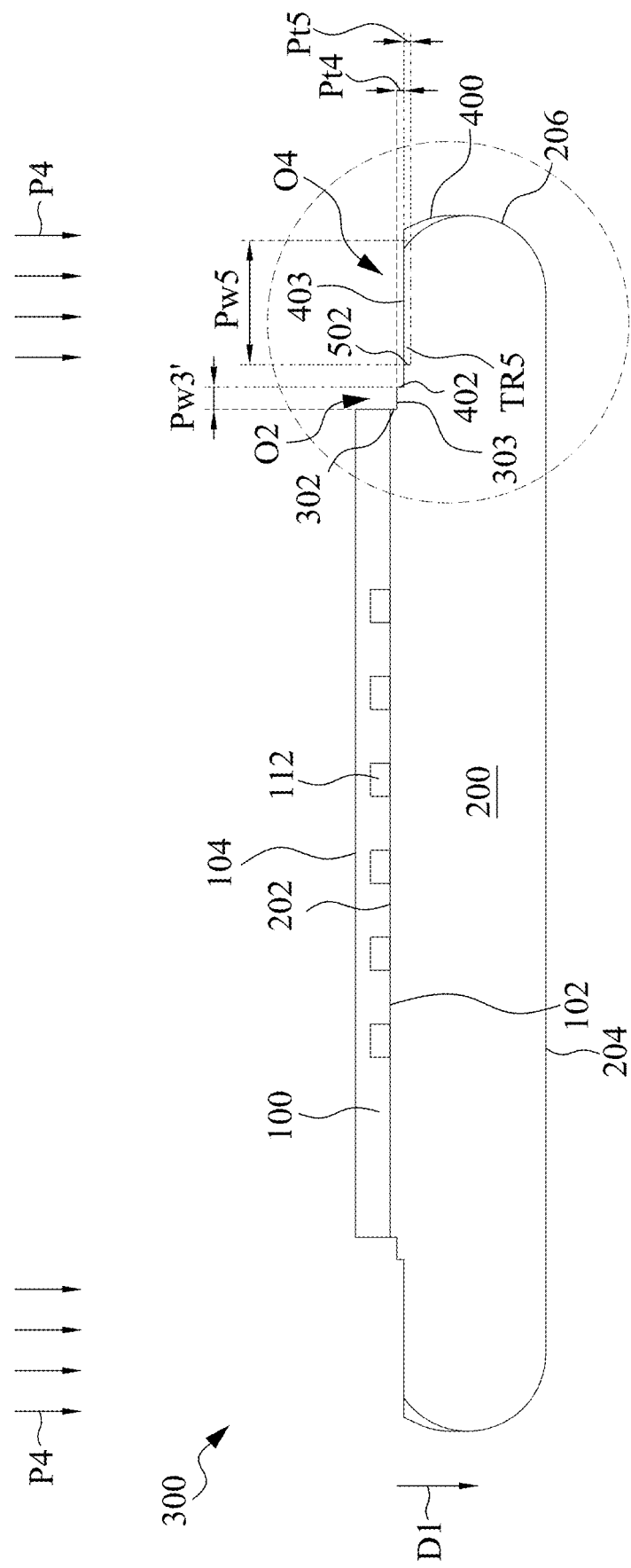
Figure 9B:
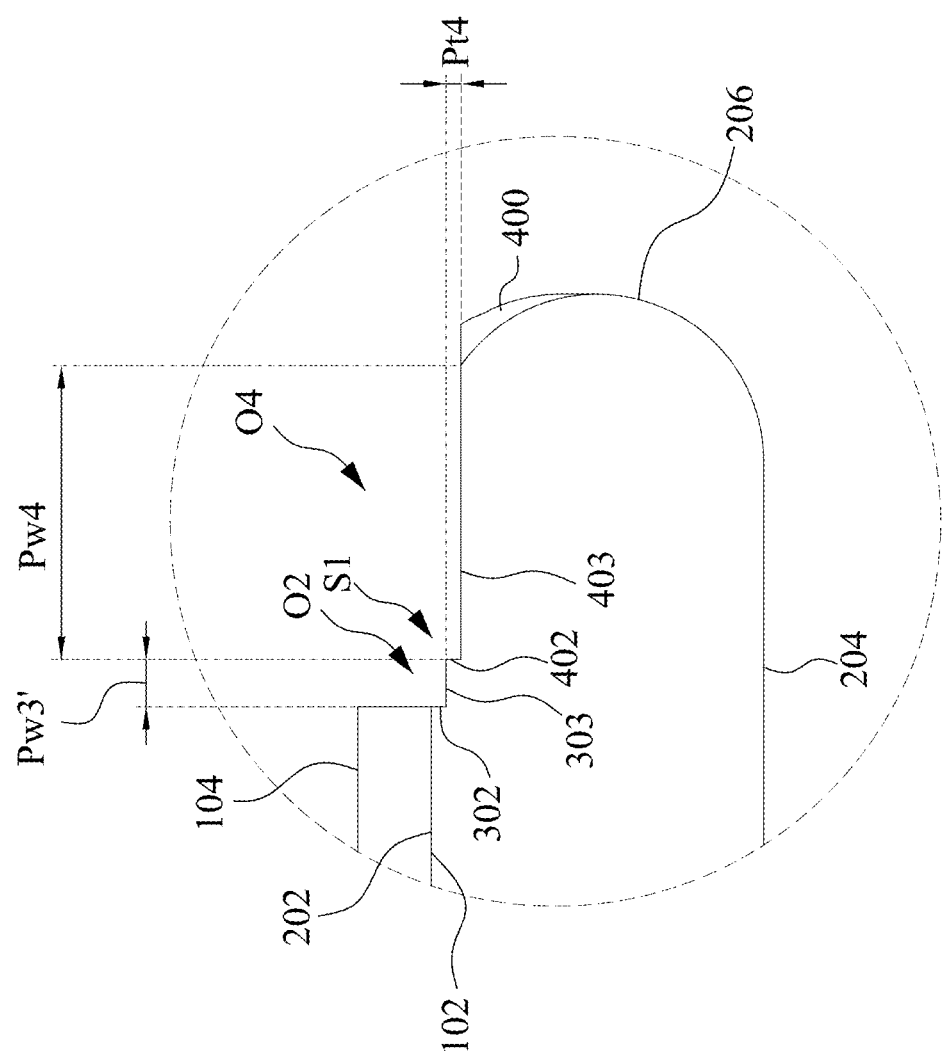

With reference to FIGS. 9A and 9B, a trimming step P4 is performed on the second wafer 200 of the stacked wafer structure 300 simultaneously with removing the remaining bonding material 400 on the edge 206 of the second wafer 200. By way of example but not limiting the present disclosure, the trimming step P4 is performed on the bottom surface 303 of the opening O2 at a position laterally spaced apart by a distance Pw3' (hereinafter referred to as a "spaced apart distance Pw3'") from the trimmed edge 302 in a direction downward toward the bottom surface 204 of the second wafer 200 along the thickness direction D1 to form a trimmed edge 402 at the periphery of the stacked wafer structure 300. By way of example but not limiting the present disclosure, the spaced apart distance Pw3' may range from about 30 microns to about 1500 microns.

In some embodiments, the trimming step P4 is performed by the trimming tool 60 (See FIG. 8B) cutting substantially vertically or slantedly into the stacked wafer structure 300 to a trimming depth Pt4. That is, during the trimming step P4, the second wafer 200 is trimmed to have a ring-shaped opening O4 having the depth Pt4 at the periphery of the wafer 200 of the stacked wafer structure 300 down to the opening O2. The trimming depth Pt4 is measured from a bottom surface 403 of the opening O4 to a reference plane extending from the bottom surface 303 of the opening O2. After the trimming step P4 is completed, a first step-like structure S1 (see FIG. 9B) is formed on the edge 206 of the second wafer 200, wherein the first step-like structure S1 comprises an upper step run 303, a lower step run 403, and a step rise 402 connecting the lower step 403 to the upper step 303. The first step-like structure S1 may have a step height (i.e., height of the step rise 402) substantially equal to the trimming depth Pt4 of the trimming step P4 and a width of the upper step run 303 substantially equal to the spaced apart distance Pw3' of the trimming step P4. In some embodiments, the trimming step P4 is carried out by mechanical machining which is similar with the trimming process P1, and therefore, a detailed description is omitted herein. In some embodiments, after the trimming steps P3 and P4 are complete, the second wafer 200 has a stepped cross-section at its periphery region as illustrated in FIG. 9B, wherein the stepped cross-section comprises the first step run 202, the second step run 303 lower than the first step run 303, and the third step run 403 lower than the second step run 303, the first step rise 402 connecting the third step run 403 to the second step run 303, and the second step rise 302 connecting the second step run 303 to the first step run 202.

In some embodiments, the trimming step P4 is performed to remove an edge portion of the stacked wafer structure 300 including an annular ring TR4 (see FIG. 8A) on the overlying second wafer 200. In some embodiments, the annular ring TR4 may be a periphery of the second wafer 200 and has a width Pw4 and a height substantially equal to the trimming depth Pt4 of the trimming step P4 (see FIG. 9B). The width Pw4 may be measured from a reference plane extending from the edge 206 of the second wafer 200 to a reference plane extending from the trimmed edge 402. It should be noted that the dimensions of the annular ring TR4 may be modified according to the dimensions of the wafer and the design requirements of the product, and are not limited to the dimensions given herein.

By way of example but not limiting the present disclosure, the trimming depth Pt4 shown in FIG. 9A (i.e., which may be substantially the same as the height of the first step-like structure S1 and the height of the annular ring TR4 shown in FIG. 8B) may range from about 1 microns to about 50 microns. By way of example but not limiting the present disclosure, the width Pw3' shown in FIG. 9A (i.e., which may be substantially the same as the width of the first step-like structure S1) may range from about 30 microns to about 1500 microns.

In some embodiments, after removing the annular ring TR4 (see FIG. 8A) of the first wafer 200, the ring-shaped opening O4 shown in FIG. 9A is formed at the periphery of the stacked wafer structure 300. The ring-shaped opening O4 has an L-shaped appearance, and the sidewall of the ring-shaped opening O4 is the trimmed edge 402. In some embodiments, the trimmed edge 402 is substantially perpendicular to the second surface 104 of the first wafer 100. In some embodiments, the trimmed edge 402 of the stacked wafer structure 300 is slanted with respect to the second surface 104. The depth of the opening O4 is the trimming depth Pt4, and the width of the opening O4 is the width Pw4 on the second wafer 200.

Figure 10A:
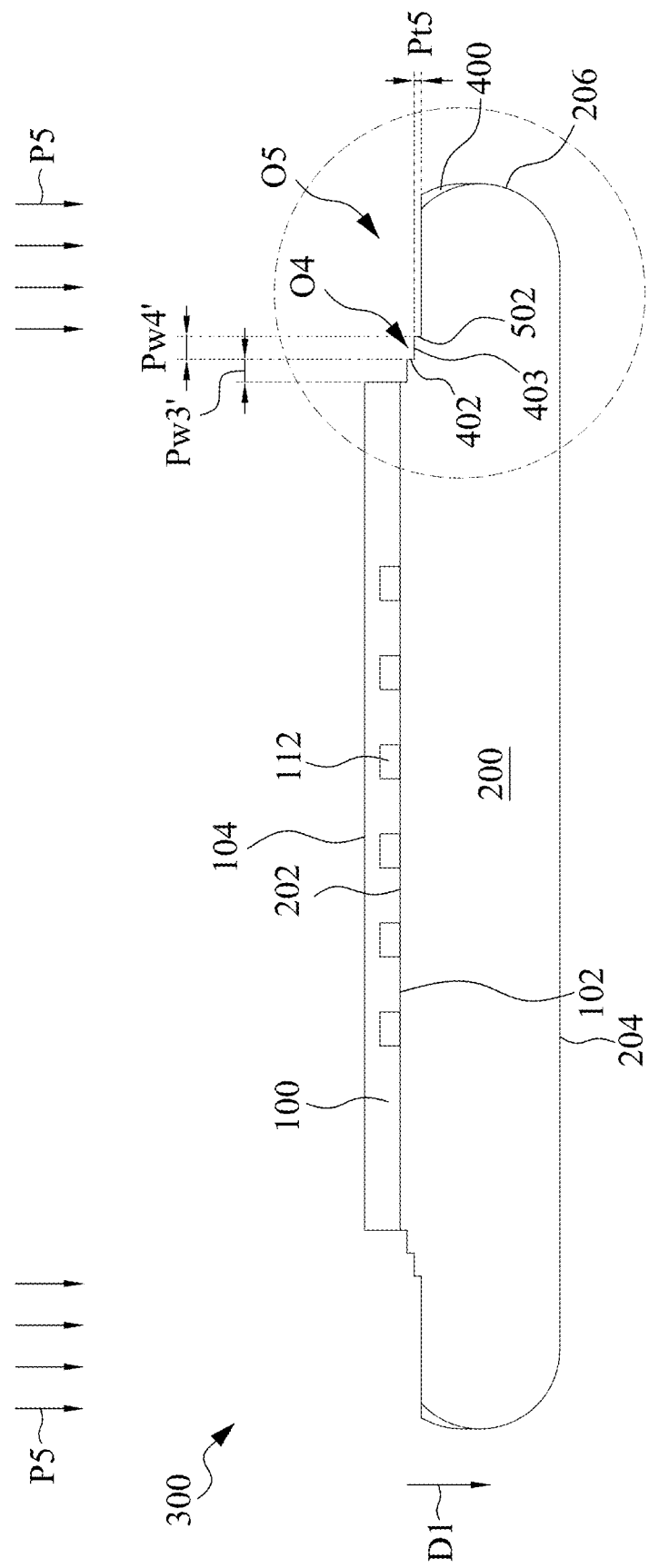
Figure 10B:
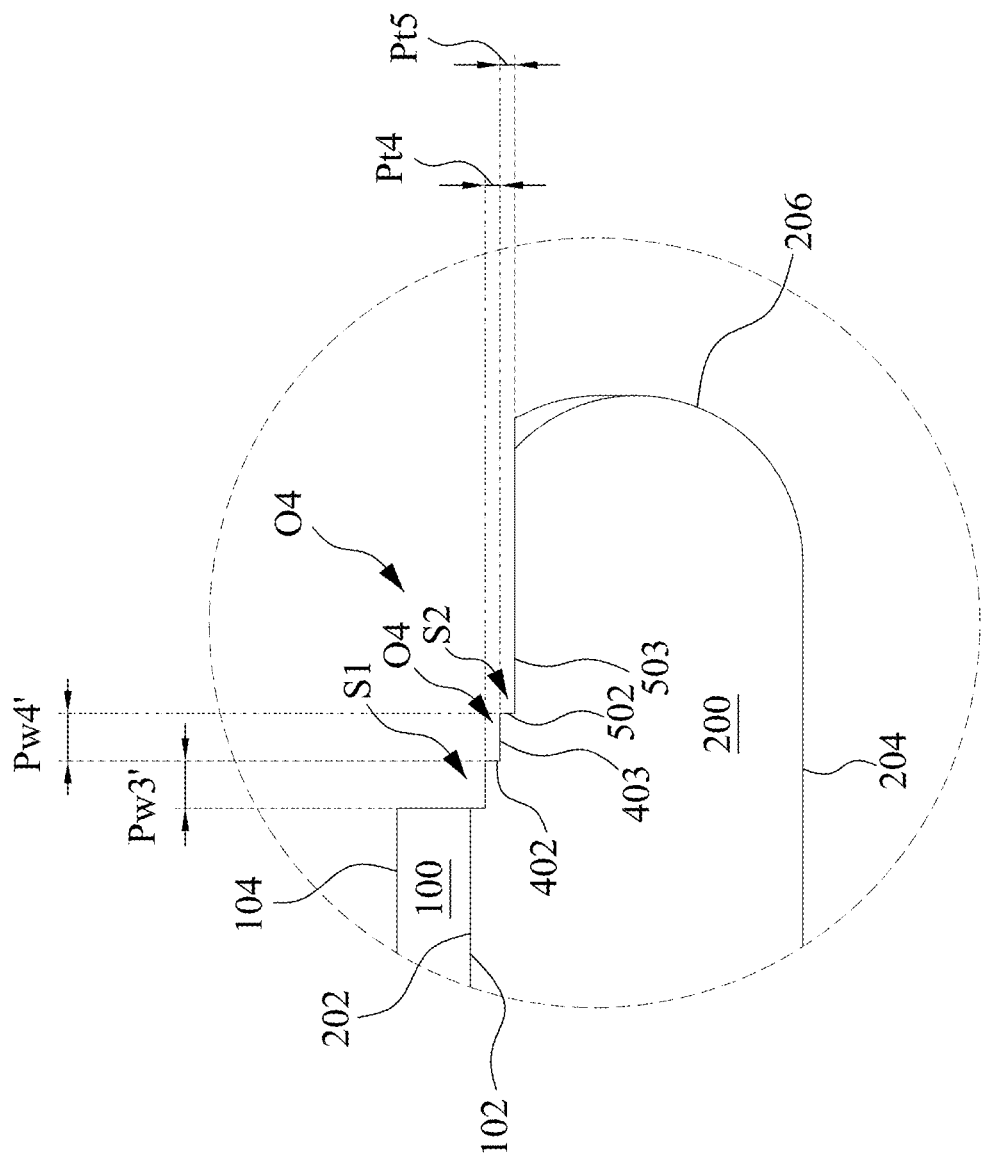
Figure 11A:
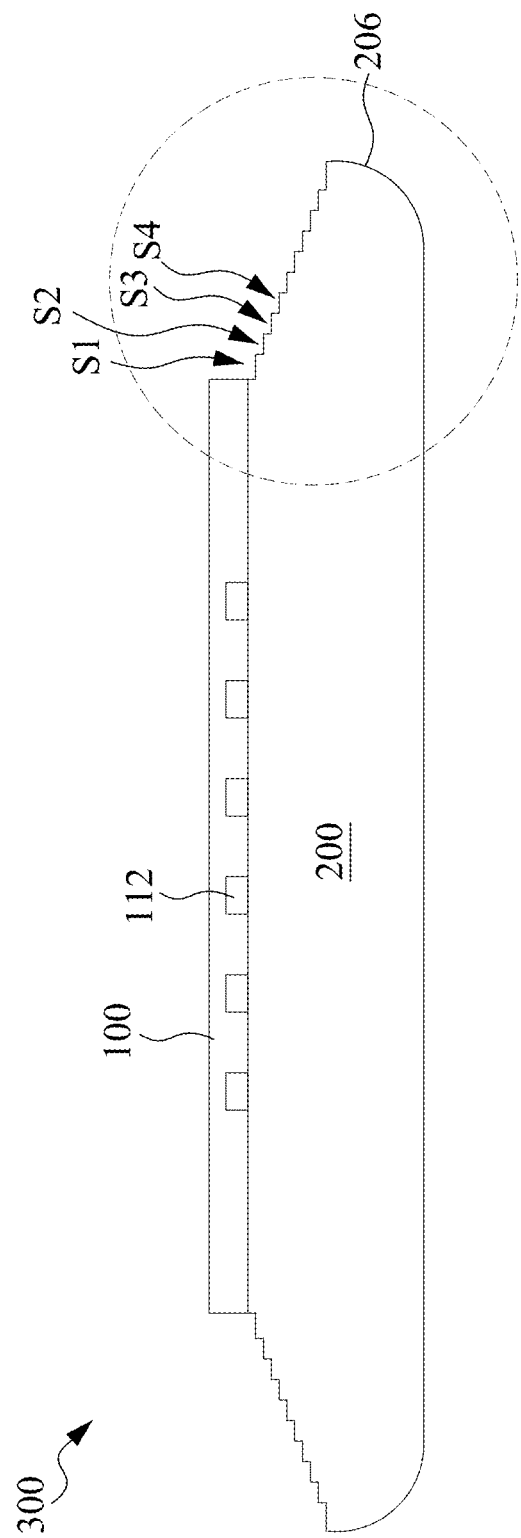
Figure 11B:
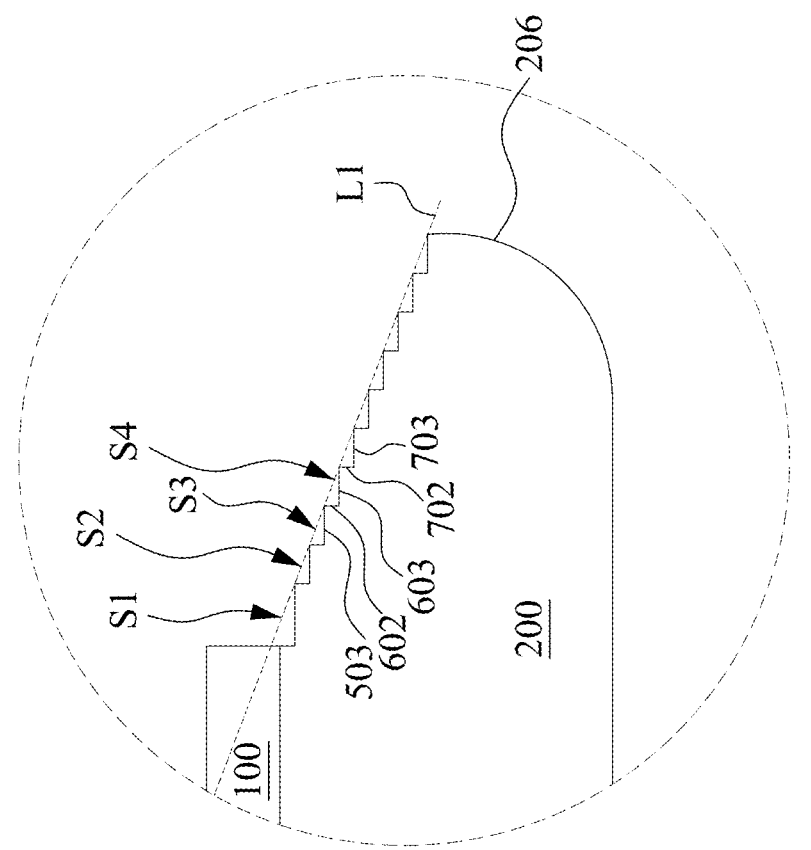

With reference to FIGS. 10A and 10B, a trimming step P5 is performed on the second wafer 200 of the stacked wafer structure 300 simultaneously with removing the remaining bonding material 400 on the edge 206 of the second wafer 200. By way of example but not limiting the present disclosure, the trimming step P5 is performed on the bottom surface 403 of the opening O4 at a position laterally spaced apart by a distance Pw4' (hereinafter referred to as a "spaced apart distance Pw4'") from the trimmed edge 402 downward toward the bottom surface 204 of the second wafer 200 along the thickness direction D1 to form a trimmed edge 502 at the periphery of the stacked wafer structure 300. By way of example but not limiting the present disclosure, the spaced apart distance Pw4' may range from about 30 microns to about 1500 microns. In some embodiments, the distance Pw4' may be substantially the same as the spaced apart distance Pw3'. In some embodiments, the spaced apart distance Pw4' may be less than the spaced apart distance Pw3'. In some embodiments, the spaced apart distance Pw4' may be greater than the spaced apart distance Pw3'.

In some embodiments, the trimming step P5 is performed by the trimming tool 60 (See FIG. 8B) cutting substantially vertically or slantedly into the stacked wafer structure 300 to a trimming depth Pt5. That is, during the trimming step P5, the second wafer 200 is trimmed to have a ring-shaped opening O5 having the depth Pt5 at the periphery of the wafer 200 of the stacked wafer structure 300 down to the opening O4. The trimming depth Pt5 is measured from a bottom surface 503 of the opening O5 to a reference plane extending from the bottom surface 403 of the opening O4. After the trimming step P5 is completed, a second step-like structure S2 (see FIG. 10B) is formed on the edge 206 of the second wafer 200 down from the first step-like structure S1 (see FIG. 10B), wherein the second step-like structure S2 comprises an upper step run 403, a lower step run 503, and a step rise 502 connecting the lower step run 503 to the upper step run 403. The second step-like structure S2 may have a step height (i.e., height of step rise 502) substantially equal to the trimming depth Pt5 of the trimming step P5 and a width of the upper step run 403 substantially equal to the spaced apart distance Pw4' of the trimming step P4. In some embodiments, the trimming step P5 is carried out by mechanical machining which is similar with the trimming process P1, and therefore, a detailed description is omitted herein. In some embodiments, after the trimming steps P3-P5 are complete, the second wafer 200 has a stepped cross-section at its periphery region as illustrated in FIG. 10B, wherein the stepped cross-section has three step rises.

In some embodiments, the trimming step P5 is performed to remove an edge portion of the stacked wafer structure 300 including an annular ring TR5 (see FIG. 9A) on the overlying second wafer 200. In some embodiments, the annular ring TR5 may be a periphery of the second wafer 200 and has a width Pw5 (see FIG. 9A) and a height substantially equal to the trimming depth Pt5 of the trimming step P5 shown in FIG. 10A. The width Pw5 (see FIG. 9A) may be measured from a reference plane extending from the edge 206 of the second wafer 200 to a reference plane extending from the trimmed edge 502. It should be noted that the dimensions of the annular ring TR5 may be modified according to the dimensions of the wafer and the design requirements of the product, and are not limited to the dimensions given herein.

By way of example but not limiting the present disclosure, the trimming depth Pt5 shown in FIG. 10B (i.e., which may be substantially the same as the height of the second step-like structure S2 and the height Ph5 of the annular ring TR5 shown in FIG. 9B) may range from about 1 microns to about 50 microns. In some embodiments, the trimming depth Pt5 shown in FIG. 10B may be substantially the same as the trimming depth Pt4. In some embodiments, the trimming depth Pt5 may be less than the trimming depth Pt4. In some embodiments, the trimming depth Pt5 may be greater than the trimming depth Pt4.

In some embodiments, after removing the annular ring TR5 (see FIG. 9A) of the first wafer 200, the ring-shaped opening O5 shown in FIG. 10A is formed at the periphery of the stacked wafer structure 300. The ring-shaped opening O5 has an L-shaped appearance, and the sidewall of the ring-shaped opening O5 is the trimmed edge 502. In some embodiments, the trimmed edge 502 is substantially perpendicular to the second surface 104 of the first wafer 100. In some embodiments, the trimmed edge 502 of the stacked wafer structure 300 is slanted with respect to the second surface 104. The depth of the opening O5 is the trimming depth Pt5, and the width of the opening O5 is the width Pw5 on the second wafer 200.

Figure 10C:
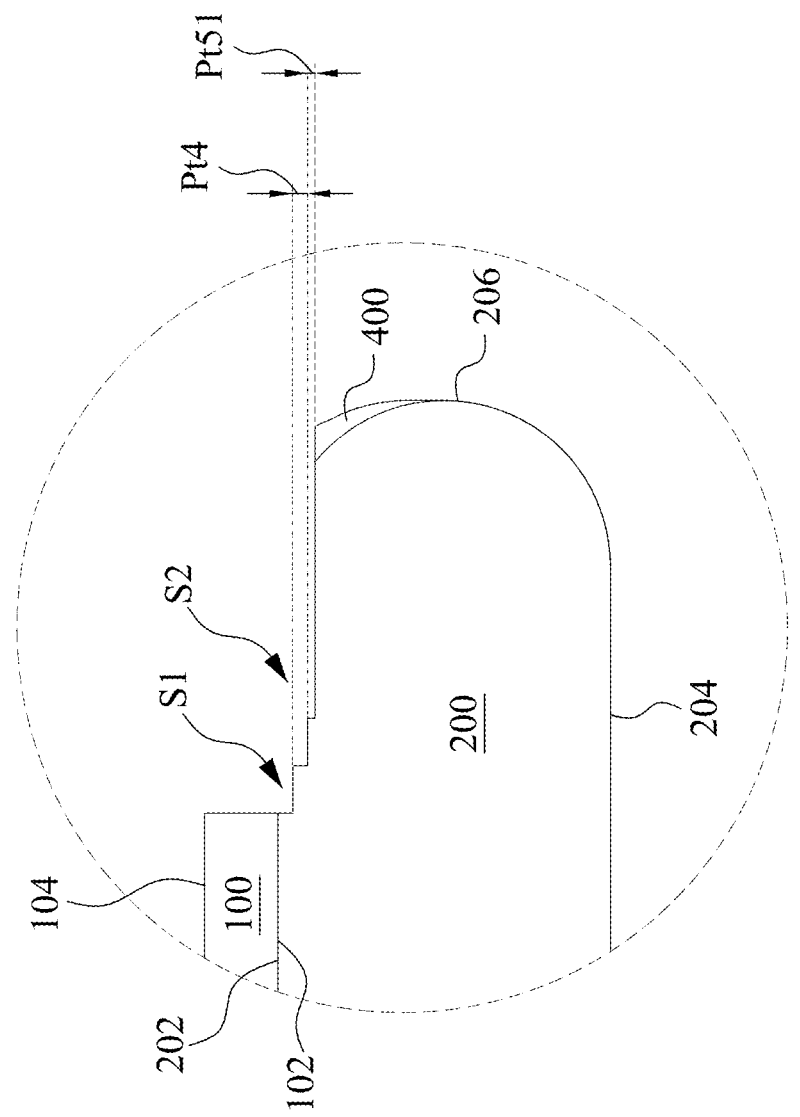
FIGS. 10C, 10D, 10E, and 10F illustrate cross-sectional views of different stacked wafer structure profiles according to FIG. 10B.

FIG. 10C illustrates a cross-sectional view of a different stacked wafer structure profile according to FIG. 10B. It is noted that some elements are not illustrated in FIG. 10C for brevity. The same or similar configurations and/or materials as described with FIGS. 2 to 10B may be employed in FIG. 10C, and a detailed explanation may be omitted. Therefore, reference may be made to the foregoing paragraphs for the related detailed descriptions, and are not described again herein. In FIG. 10C, the second step-like structure S2 formed on the edge 206 of the second wafer 200 down from the first step-like structure S1 may have a lower height Pt51 than the height Pt4 of the first step-like structure S1.

Figure 10D:
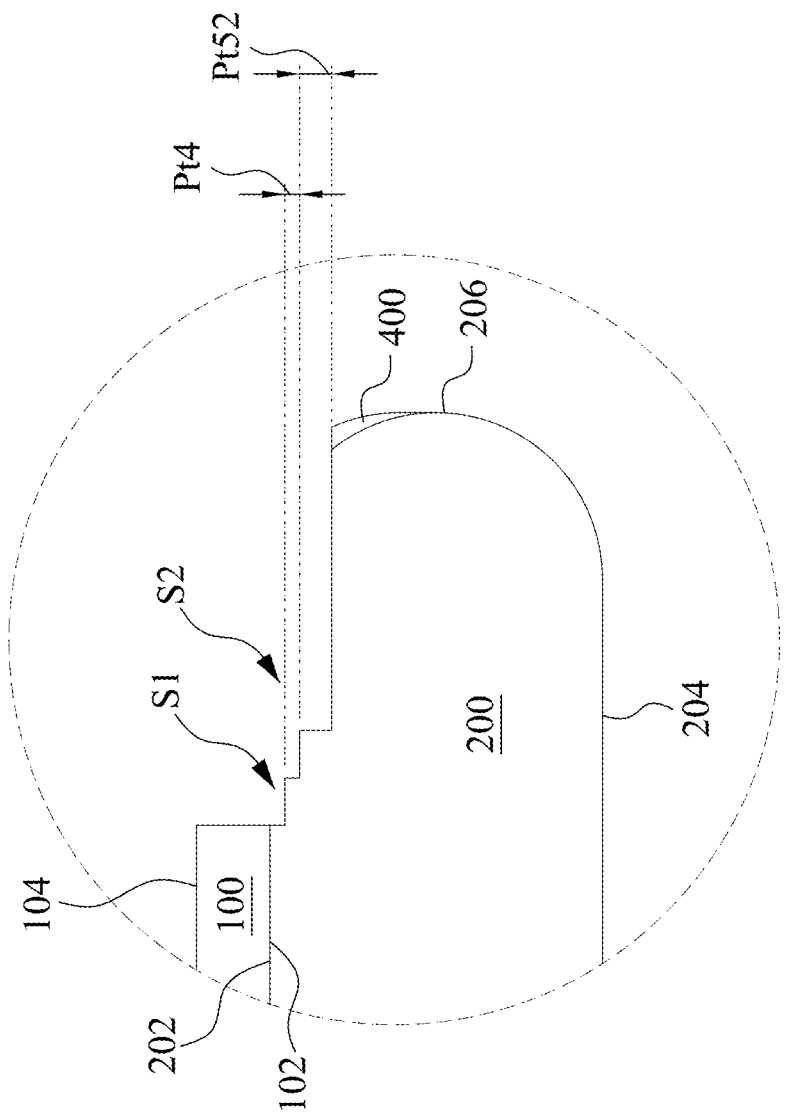

FIG. 10D illustrates a cross-sectional view of a different stacked wafer structure profile according to FIG. 10B. It is noted that some elements are not illustrated in FIG. 10D for brevity. The same or similar configurations and/or materials as described with FIGS. 2 to 10B may be employed in FIG. 10D, and a detailed explanation may be omitted. Therefore, reference may be made to the foregoing paragraphs for the related detailed descriptions, and are not described again herein. In FIG. 10D, the second step-like structure S2 formed on the edge 206 of the second wafer 200 down from the first step-like structure S1 may have a greater height Pt52 than the height Pt4 of the first step-like structure S1.

Figure 10E:
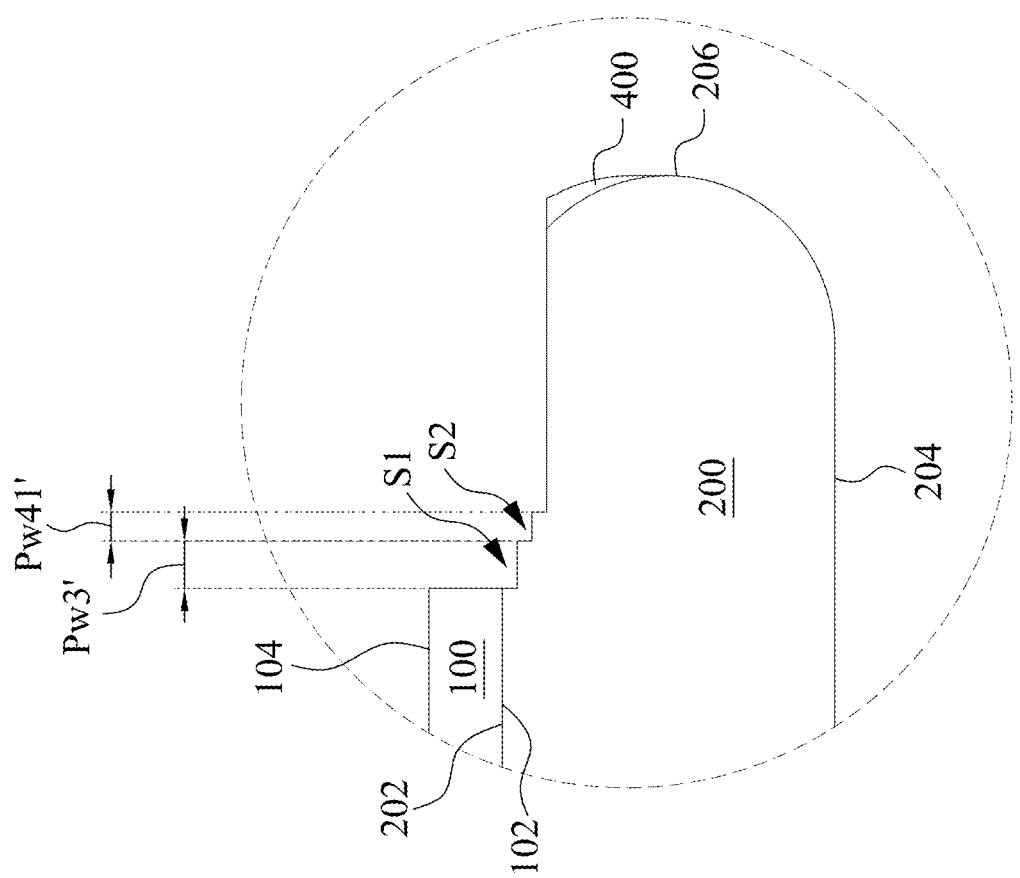

FIG. 10E illustrates a cross-sectional view of a different stacked wafer structure profile according to FIG. 10B. It is noted that some elements are not illustrated in FIG. 10E for brevity. The same or similar configurations and/or materials as described with FIGS. 2 to 10B may be employed in FIG. 10E, and a detailed explanation may be omitted. Therefore, reference may be made to the foregoing paragraphs for the related detailed descriptions, and are not described again herein. In FIG. 10E, the second step-like structure S2 formed on the edge 206 of the second wafer 200 down from the first step-like structure S1 may have a lower width Pw41' than the width Pw3' of the first step-like structure S1.

Figure 10F:
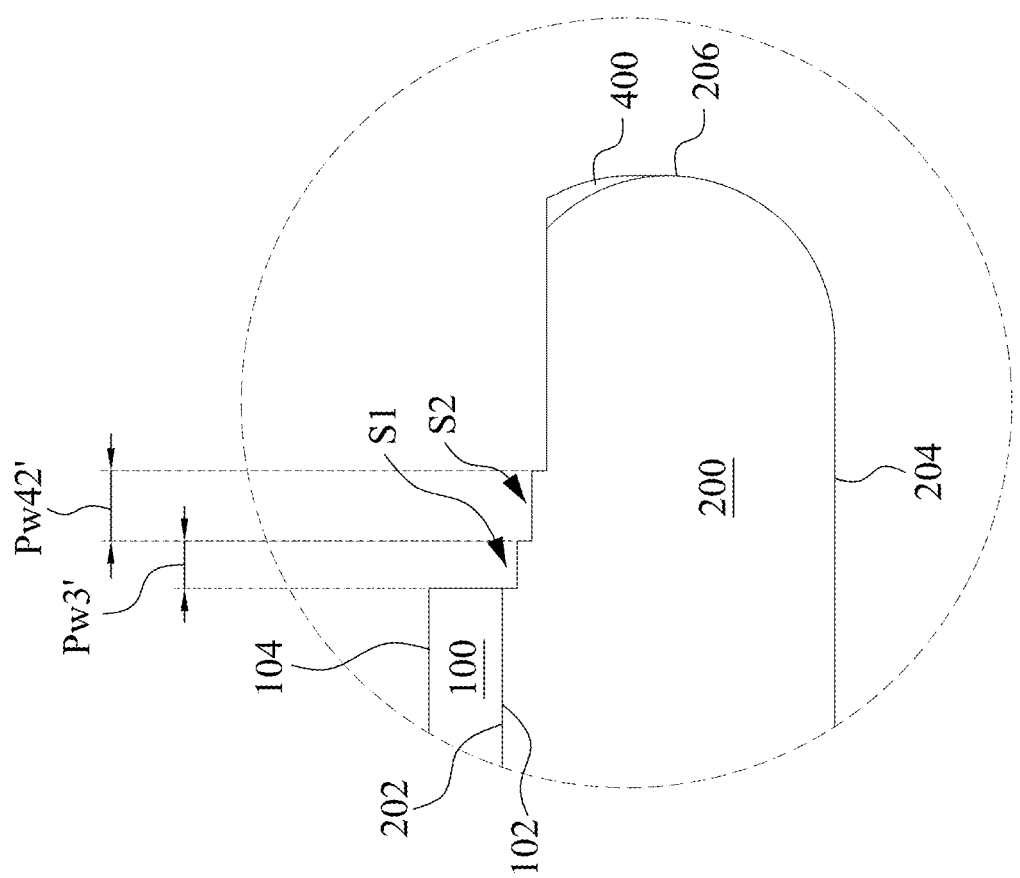

FIG. 10F illustrates a cross-sectional view of a different stacked wafer structure profile according to FIG. 10B. It is noted that some elements are not illustrated in FIG. 10F for brevity. The same or similar configurations and/or materials as described with FIGS. 2 to 10B may be employed in FIG. 10F, and a detailed explanation may be omitted. Therefore, reference may be made to the foregoing paragraphs for the related detailed descriptions, and are not described again herein. In FIG. 10F, the second step-like structure S2 formed on the edge 206 of the second wafer 200 down from the first step-like structure S1 may have a greater width Pw42' than the width Pw3' of the first step-like structure S1.

With reference to FIGS. 11A and 11B, a least one trimming step similar with the trimming process P1 or P2 may be sequentially performed on the second wafer 200 of the stacked wafer structure 300 simultaneously with removing the remaining bonding material 400 on the edge 206 of the second wafer 200 until all of the remaining bonding material 400 is removed from the second wafer, such that a stepped sidewall is formed on the edge 206 of the second wafer 200. By way of example but not limiting the present disclosure, a third step-like structure S3 (see FIG. 11B) is formed on the edge 206 of the second wafer 200 down from the second step-like structure S2 and a fourth step-like structure S4 (see FIG. 11B) is formed on the edge 206 of the second wafer 200 down from the third step-like structure S3, wherein the third step-like structure S3 comprises an upper step run 503, a lower step run 603, and a step rise 602 connecting the lower step run 603 to the upper step run 503, and the fourth step-like structure S4 comprises an upper step run 603, a lower step run 703, and a step rise 702 connecting the lower step run 703 to the upper step run 603. In some embodiments, the third step-like structure S3 may have a step height (i.e., height of step rise 602) the same as the step height of the second step-like structure S2, and/or have a same width as the step-like structure S2. In some embodiments, the third step-like structure S3 may have a greater step height than the second step-like structure S2 and/or have a greater width than the second step-like structure S2. In some embodiments, the third step-like structure S3 may have a less step height than the second step-like structure S2 and/or have a less width than the second step-like structure S2. In FIG. 11B, an imaginary line L1 formed by abutting against outer and uppermost edges of the step-like structures in the stepped sidewall is straight. In some embodiments, the step-like structures in the stepped sidewall are above a widest position of the second wafer.

The stepped sidewall on the edge 206 of the second wafer 200 may allow for improving the adhesion between the second wafer 200 and the subsequent coating material on the second wafer 200, such that the subsequent coating material may only minimally fall off the edge 206 of the second wafer 200. Therefore, the pollution on the first wafer 100 due to the subsequent coating material may be reduced, so as to increase production efficiency and lower associated costs.

In some embodiments, after the multi-trimming process is completed, a cleaning process may be performed on the stacked wafer structure 300. In some embodiments, the cleaning process may be carried out by means of wet cleaning with a liquid medium, such as tetramethylammonium hydroxide (TMAH), which may selectively remove the surface contaminants and particulates without attacking or chemically altering the second surface 104 of the first wafer 100.

Figure 11C:
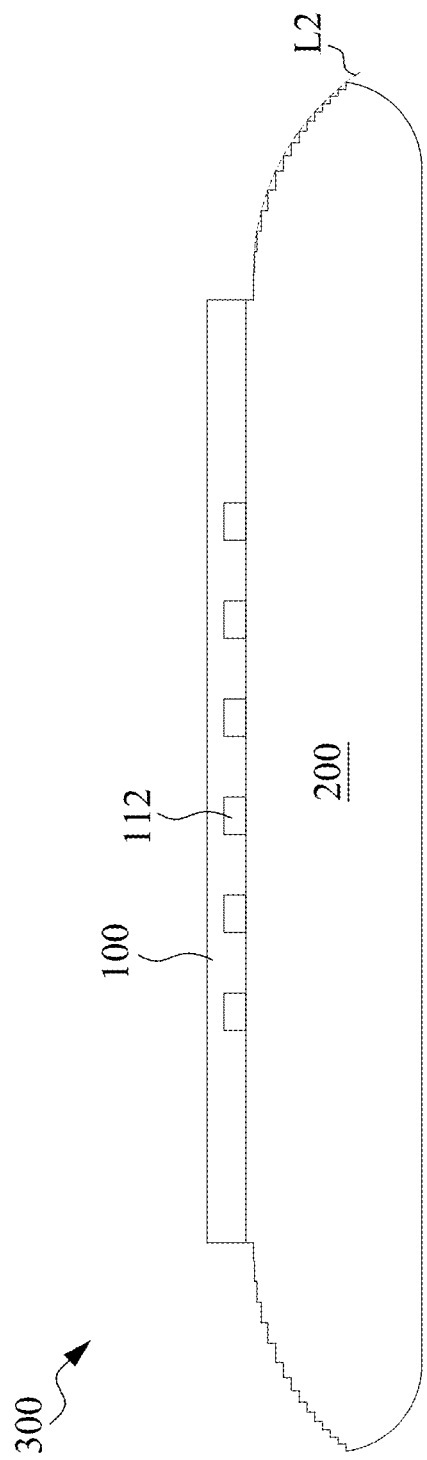
FIGS. 11C, 11D, and 11E illustrate cross-sectional views of different stacked wafer structure profiles according to FIG. 11B.

FIG. 11C illustrates a cross-sectional view of a different stacked wafer structure profile according to FIG. 11B. It is noted that some elements are not illustrated in FIG. 11D for brevity. The same or similar configurations and/or materials as described with FIGS. 2 to 11B may be employed in FIG. 11C, and a detailed explanation may be omitted. Therefore, reference may be made to the foregoing paragraphs for the related detailed descriptions, and are not described again herein. In FIG. 11C, an imaginary line L2 formed by abutting against outer and uppermost edges of the step-like structures in the stepped sidewall forms a convex surface. On the other hand, in some embodiments, when in a cross sectional view, an imaginary plane formed by abutting against outer and uppermost edges of two separated step-like structures passes through a top surface of a step-like structure between the two separated step-like structures.

Figure 11D:
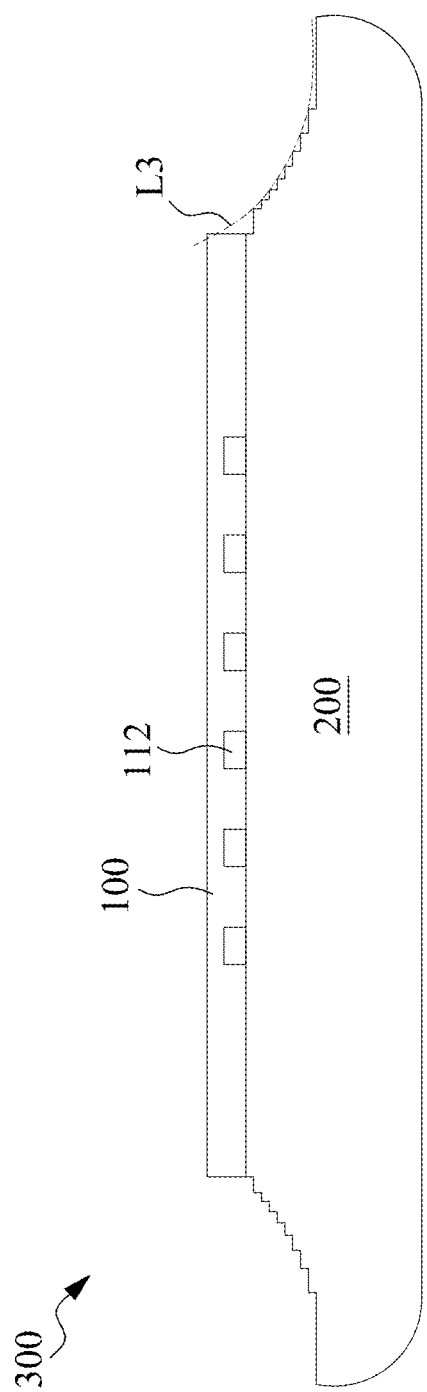

FIG. 11D illustrates a cross-sectional view of a different stacked wafer structure profile according to FIG. 11B. It is noted that some elements are not illustrated in FIG. 11D for brevity. The same or similar configurations and/or materials as described with FIGS. 2 to 11B may be employed in FIG. 11D, and a detailed explanation may be omitted. Therefore, reference may be made to the foregoing paragraphs for the related detailed descriptions, and are not described again herein. In FIG. 11D, an imaginary line L3 formed by abutting against outer and uppermost edges of the step-like structures in the stepped sidewall forms a concave surface. On the other hand, in some embodiments, when in a cross sectional view, an imaginary plane formed by abutting against outer and uppermost edges of two separated step-like structures is spaced apart from a step-like structure between the two separated step-like structures.

Figure 11E:
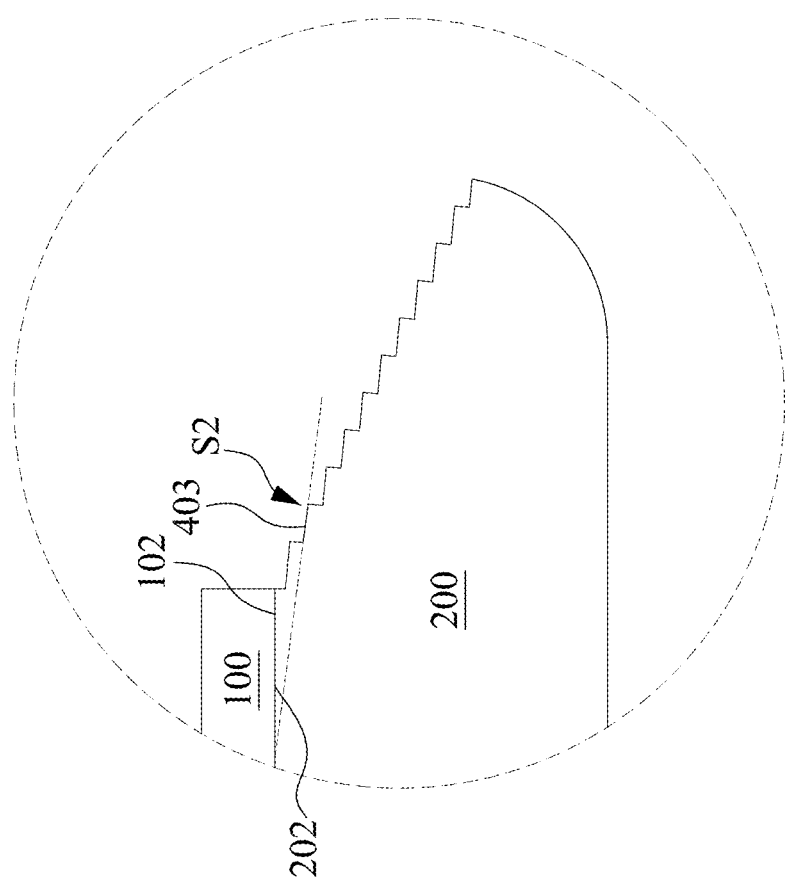

FIG. 11E illustrates a cross-sectional view of a different stacked wafer structure profile according to FIG. 11B. It is noted that some elements are not illustrated in FIG. 11E for brevity. The same or similar configurations and/or materials as described with FIGS. 2 to 11B may be employed in FIG. 11E, and a detailed explanation may be omitted. Therefore, reference may be made to the foregoing paragraphs for the related detailed descriptions, and are not described again herein. In FIG. 11E, each trimming step of the multi-trimming process is performed by the trimming tool 60 (See FIG. 8B) cutting slantedly into the second wafer 200 of the stacked wafer structure 300, such that the trimmed edge is slanted with respect to the first surface 102 of the first wafer 100.

Figure 12:
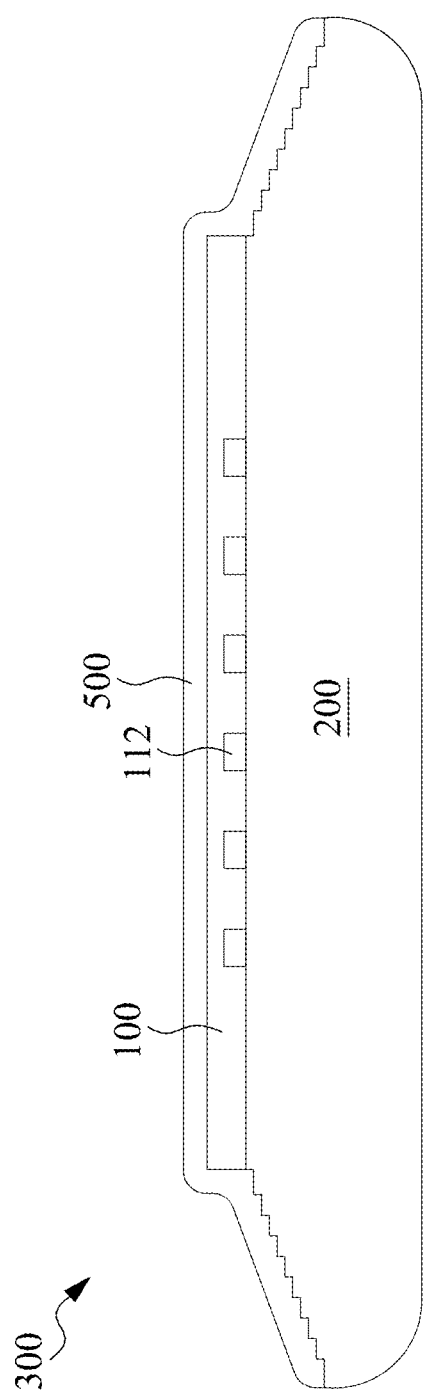

Referring back to FIG. 1, the method M then proceeds to block S108 where a semiconductor device manufacturing process is performed on a backside of the thinned first wafer. With reference to FIG. 12, in some embodiments of block S108, once all of the bonding material 400 is removed, additional processes, such as back end processes, can be performed on the backside of the first wafer 100. The stepped sidewall on the edge 206 of the second wafer 200 may allow for improving the adhesion between the second wafer 200 and the coating material 500 formed on the second wafer 200 from the additional processes, such that the coating material 500 may only minimally fall off the edge 206 of the second wafer 200. Therefore, the pollution on the first wafer 100 due to the coating material 500 may be reduced, so as to increase production efficiency and lower associated costs. In some embodiments, the first wafer 100 may be further thinned (i.e., the thickness of the first wafer 100 is reduced) by a thinning process in a state in which the second wafer 200 carries the first wafer 100 until it reaches the desired thickness before the semiconductor device manufacturing process. In some embodiments, the thinning process may be a mechanical machining process. The thinning process may include, for example, a grinding process, a chemical mechanical polishing (CMP) process, or another suitable polishing process. In some embodiments, the thinning process may include a dry etch, a wet etch, a reactive ion etch (RIE), or another suitable etching process. In some embodiments, the wafer thinning process includes one or more thin-down processes.

Based on the above discussion, it can be seen that the present disclosure offers advantages. It is understood, however, that other embodiments may offer additional advantages, and not all advantages are necessarily disclosed herein. Moreover, no particular advantage is required for all embodiments. In order to perform processes on a backside of a first wafer, an additional second wafer may be bonded to a frontside of the first wafer and function as a carrier wafer. During coating processes on the backside of the first wafer, the coating material, such as photoresist (PR), middle layer (ML) of a tri-layer resist, and bottom layer (BL) of the tri-layer resist may also deposit on a steep wafer edge of the underlying second wafer. Other embodiments may contain more or fewer number of layers in the resist, such as a tetra-layer resist. However, the coating material may have a poor adhesion to the steep wafer edge, which may cause the coating material to fall off the steep wafer edge of the underlying second wafer and further pollute the first wafer. Therefore, the present disclosure in various embodiments provides a multi-trimming process on the underlying second wafer. An advantage is that after the multi-trimming process is performed, the underlying second wafer may have a stepped sidewall structure having more than two step rises which in turn allows for improving the adhesion between the coating material and the underlying second wafer, such that the coating material may only minimally fall off the edge of the second wafer, and thus the pollution on the first wafer may be reduced, so as to increase production efficiency and lower associated costs.

In some embodiments, a method includes a method includes bonding a front side surface of a first wafer to a second wafer; performing a multi-trimming process on the first and second wafers from a back side surface of the first wafer, the multi-trimming process comprising: performing a first trimming step from the back side surface of the first wafer to cut through a periphery of the first wafer; performing a second trimming step on the second wafer to partially cut a periphery of the second wafer to form a first step-like structure; and performing a third trimming step on the second wafer to partially cut the periphery of the second wafer to form a second step-like structure connecting down from the first step-like structure; after performing the multi-trimming process, forming a coating material at least over the periphery of the second wafer. In some embodiments, a step rise of the first step-like structure has a height in a range from about 0.001 mm to about 0.05 mm. In some embodiments, a step run of the first step-like structure has a width in a range from about 0.03 mm to about 1.5 mm. In some embodiments, the multi-trimming process further comprises: performing a fourth trimming step on the second wafer to partially cut the periphery of the second wafer to form a third step-like structure connecting down from the second step-like structure. In some embodiments, the multi-trimming process further comprises: performing a fifth trimming step on the second wafer to partially cut the periphery of the second wafer to form a fourth step-like structure connecting down from the third step-like structure. In some embodiments, a step rise of the second step-like structure has a same height as a step rise of the first step-like structure. In some embodiments, a step run of the second step-like structure has a same width as a step run of the first step-like structure. In some embodiments, a top surface of the first step-like structure of the second wafer extends at a tilt angle relative to the front side surface of the first wafer. In some embodiments, an imaginary plane formed by extending along and past a top surface of the second step-like structure passes through the back side surface of the first wafer. In some embodiments, the first and second step-like structures are above a widest position of the second wafer.

In some embodiments, a method includes rotating a wafer edge trimming cutter; performing a first trimming process by moving the wafer edge trimming cutter toward an edge of a stacked wafer structure to trim the edge of the stacked wafer structure; after performing the first trimming process, performing a second trimming process by positioning the wafer edge trimming cutter away from a center axis of the stacked wafer structure a first lateral distance in the direction toward a periphery of the stacked wafer structure and downward a first vertical distance to trim the edge of the stacked wafer structure; after performing the second trimming process, performing a third trimming process by positioning the wafer edge trimming cutter away from the center axis of the stacked wafer structure a second lateral distance in a direction toward the periphery of the stacked wafer structure and downward a second vertical distance to trim the edge of the stacked wafer structure; forming a coating material over the stacked wafer structure. In some embodiments, after performing the third trimming process, performing a fourth trimming process by positioning the wafer edge trimming cutter away from the center axis of the stacked wafer structure a third lateral distance in the direction toward the periphery of the stacked wafer structure and downward a third vertical distance to trim the edge of the stacked wafer structure. In some embodiments, the second lateral distance is in a range from about 0.03 mm to about 1.5 mm. In some embodiments, the second lateral distance is different than the first lateral distance. In some embodiments, the second vertical distance is in a range from about 0.001 mm to about 0.05 mm. In some embodiments, the second vertical distance is different than the first vertical distance.

In some embodiments, a method includes bonding a front side surface of a device wafer to a carrier wafer; forming a bonding material on a periphery of the device wafer and a periphery of the carrier wafer; after forming the bonding material, performing a thinning process on the device wafer from a back side surface of the device wafer; after performing the thinning process, performing a first trimming process from the back side surface of the device wafer to remove a first portion of the bonding material and partially trim down the periphery of the carrier wafer to a first level height; performing a second trimming process on the carrier wafer to remove a second portion of the bonding material and partially trim down the periphery of the carrier wafer to a second level height lower than the first level height; performing a third trimming process on the carrier wafer to remove a third portion of the bonding material and partially trim down the periphery of the carrier wafer to a third level height lower than the second level height. The method further includes: after performing the third trimming process, forming a coating material at least over the periphery of the carrier wafer. The method further includes: performing a fourth trimming process on the carrier wafer to remove a fourth portion of the bonding material and partially trim down the periphery of the carrier wafer to a fourth level height lower than the third level height. The method further includes: performing a cleaning process on the front side surface of the device wafer prior to bonding the front side surface of the device wafer to the carrier wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   bonding a front side surface of a first wafer to a front side of a second wafer;
   forming a bonding material on a periphery of the first wafer and a periphery of the second wafer, wherein forming the bonding material is performed by a spot glue process;
   performing a thinning process on the first wafer from a back side surface of the first wafer; and
   after performing the thinning process, performing a first trimming process from the back side surface of the first wafer to remove a first portion of the bonding material and partially trim down the periphery of the second wafer from the front side surface of the second wafer.

2. The method of claim 1, further comprising:
   before bonding the front side surface of the first wafer to the front side of the second wafer, performing a second trimming process from the front side surface of the first wafer to partially cut the periphery of the first wafer, wherein a trimmed edge is formed on the first wafer.

3. The method of claim 2, wherein forming the bonding material is performed such that the bonding material is formed on the trimmed edge of the first wafer.

4. The method of claim 2, wherein performing the thinning process is performed to reach the trimmed edge of the first wafer.

5. The method of claim 1, wherein forming the bonding material is performed to leave the back side surface of the first wafer and a back side surface of the second wafer uncovered by the bonding material.

6. The method of claim 1, further comprising:
   after performing the first trimming process, performing a second trimming process from the back side surface of the first wafer to remove a second portion of the bonding material and further partially trim down the periphery of the second wafer from the front side surface of the second wafer to form a first step-like structure.

7. The method of claim 6, further comprising:
after performing the second trimming process, forming a coating material over the back side surface of the first wafer and the first step-like structure.

8. The method of claim 6, further comprising:
after performing the second trimming process, performing a third trimming process from the back side surface of the first wafer to remove a third portion of the bonding material and further partially trim down the periphery of the second wafer from the front side surface of the second wafer to form a second step-like structure connecting down from the first step-like structure.

9. The method of claim 8, wherein the second step-like structure is closer to a back side surface of the second wafer than the first step-like structure.

10. A method, comprising:
performing a first trimming process on a stacked wafer structure, wherein the first trimming process trims a periphery of the stacked wafer structure;
performing a second trimming process on the stacked wafer structure, wherein the second trimming process further trims the periphery of the stacked wafer structure to form a first step-like structure;
performing a third trimming process on the stacked wafer structure, wherein the third trimming process further trims the periphery of the stacked wafer structure to form a second step-like structure connecting down from the first step-like structure, and a step run of the second step-like structure substantially has a same width as a step run of the first step-like structure; and
performing a fourth trimming process on the stacked wafer structure, wherein the fourth trimming process further trims the periphery of the stacked wafer structure to form a third step-like structure connecting down from the second step-like structure.

11. The method of claim 10, wherein a step height of the second step-like structure has a same vertical dimension as a step height of the first step-like structure.

12. The method of claim 10, wherein a step height of the second step-like structure has a different vertical dimension than a step height of the first step-like structure.

13. The method of claim 10, further comprising:
performing a fifth trimming process on the stacked wafer structure, wherein the fifth trimming process further trims the periphery of the stacked wafer structure to form a fourth step-like structure connecting down from the third step-like structure.

14. The method of claim 10, further comprising:
after performing the third trimming process, depositing a photoresist material over the first and second step-like structures.

15. A method, comprising:
performing a first trimming process from a front side surface of a first wafer to partially cut a periphery of the first wafer, wherein a trimmed edge is formed on the first wafer;
after performing the first trimming process, bonding the front side surface of the first wafer to a front side of a second wafer;
forming a bonding material around the trimmed edge of the first wafer and interposing between the first and second wafers;
thinning down the first wafer from a back side surface of the first wafer such that the bonding material interposing between the first and second wafers is exposed;
after thinning down the first wafer, performing a second trimming process from the back side surface of the first wafer to remove a first portion of the bonding material and partially trim down a periphery of the second wafer from the front side surface of the second wafer; and
after performing the second trimming process, performing a third trimming process from the back side surface of the first wafer to remove a second portion of the bonding material and further partially trim down the periphery of the second wafer from the front side surface of the second wafer to form a first step-like structure.

16. The method of claim 15, wherein thinning down the first wafer is performed such that the back side surface of the first wafer is level with a back side surface of the bonding material.

17. The method of claim 15, wherein thinning down the first wafer removes a third portion of the bonding material interposing between the first and second wafers.

18. The method of claim 15, wherein after performing the third trimming process, performing a fourth trimming process from the back side surface of the first wafer to remove a third portion of the bonding material and further partially trim down the periphery of the second wafer from the front side surface of the second wafer to form a second step-like structure connecting down from the first step-like structure.

19. The method of claim 15, wherein forming the bonding material is performed by a spot glue process.

20. The method of claim 15, wherein the bonding material comprises an epoxy resin, a cyanate ester, a fragrant force-epoxidation, or combinations thereof.

* * * * *